(12) United States Patent
Oyamada

(10) Patent No.: US 8,294,360 B2
(45) Date of Patent: *Oct. 23, 2012

(54) LIGHT-EMITTING ELEMENT AND DISPLAY PANEL

(75) Inventor: Takahito Oyamada, Machida (JP)

(73) Assignee: Pioneer Corporation, Kanagawa (JP)

( * ) Notice: Subject to any disclaimer, the term of this patent is extended or adjusted under 35 U.S.C. 154(b) by 17 days.

This patent is subject to a terminal disclaimer.

(21) Appl. No.: 12/936,875

(22) PCT Filed: Dec. 4, 2008

(86) PCT No.: PCT/JP2008/072065
§ 371 (c)(1),
(2), (4) Date: Nov. 8, 2010

(87) PCT Pub. No.: WO2009/125518
PCT Pub. Date: Oct. 15, 2009

(65) Prior Publication Data
US 2011/0042694 A1 Feb. 24, 2011

(30) Foreign Application Priority Data
Apr. 7, 2008 (WO) .................. PCT/JP2008/056899

(51) Int. Cl.
*H01J 1/62* (2006.01)
(52) U.S. Cl. ........................................ 313/504; 313/506
(58) Field of Classification Search ........... 313/498–512
See application file for complete search history.

(56) References Cited

U.S. PATENT DOCUMENTS

2004/0061108 A1 4/2004 Fukuyama et al.
2004/0217700 A1 11/2004 Chang
2006/0220532 A1 10/2006 Tanabe et al.
2008/0029710 A1 2/2008 Sekiya et al.
2009/0230845 A1* 9/2009 Kuma et al. .................. 313/504

FOREIGN PATENT DOCUMENTS

| CN | 101097994 | 1/2008 |
|---|---|---|
| JP | 2000-268971 | 9/2000 |
| JP | 2004-079452 | 3/2004 |
| JP | 2004-327373 | 11/2004 |
| JP | 2006-310257 | 11/2006 |
| JP | 2007-012369 | 1/2007 |
| JP | 2008-028371 | 2/2008 |
| JP | 2008-041361 | 2/2008 |
| JP | 2008-059905 | 3/2008 |
| WO | 2006098188 | 9/2006 |

OTHER PUBLICATIONS

International Search Report, PCT/JP2008/056899, May 13, 2008.
Extended European Search Report issued from the European Patent Office on Nov. 7, 2011 in European Patent Application No. 08873874.5, 8 pages.

* cited by examiner

*Primary Examiner* — Bumsuk Won
(74) *Attorney, Agent, or Firm* — Young & Thompson

(57) ABSTRACT

A light-emitting device includes a transparent or semitransparent first electrode, a second electrode that forms a pair with the first electrode and reflects light, and organic semiconductor layers, which include a photoelectric converting layer that emits light by recombining holes removed from one of the first electrode and the second electrode with electrons removed from the other of the first electrode and the second electrode, wherein the organic semiconductor layers include between the first electrode and the photoelectric converting layer a light extraction improving layer, which contains at least silver or gold in part as a component, partially reflects light, and has transparency.

9 Claims, 18 Drawing Sheets

[FIG. 1]
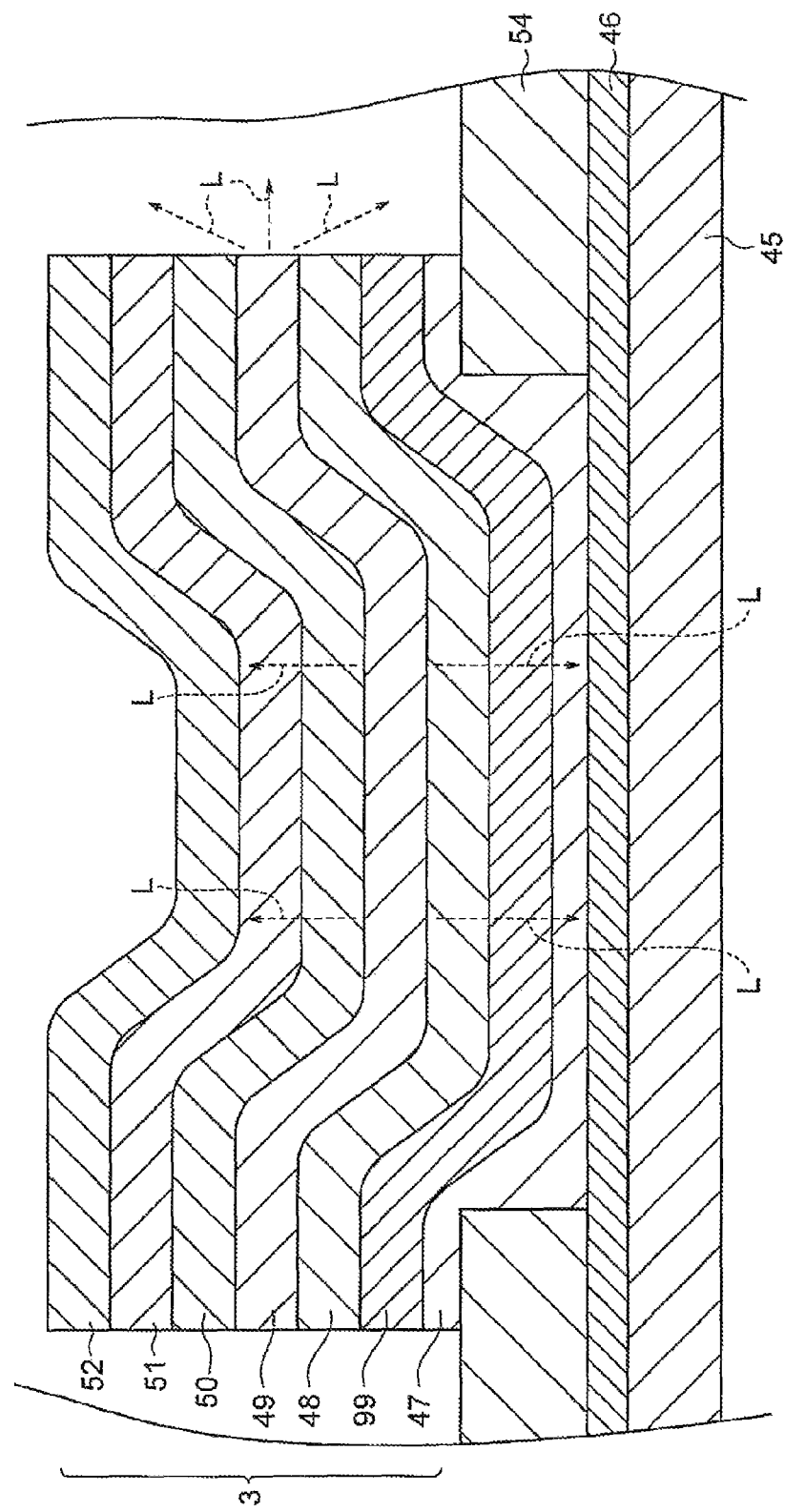

[FIG. 2]
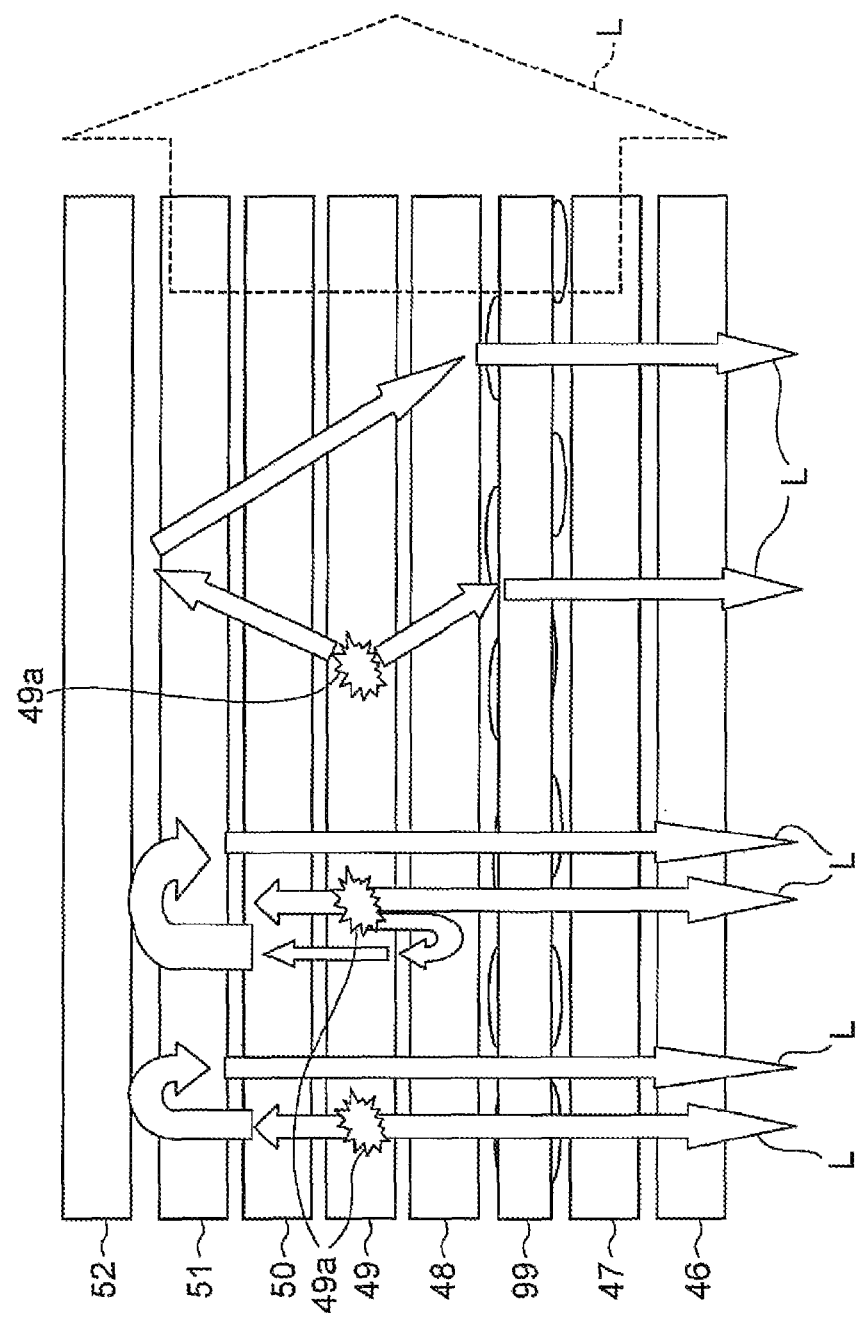

[FIG. 3]

|  | V @7.5mA/cm² | L(cd/m²) @7.5mA/cm² | EL(cd/A) @7.5mA/cm² |
|---|---|---|---|
| Ref | 4.50 | 274 | 3.7 |

[FIG. 4]

|  | V @7.5mA/cm² | L(cd/m²) @7.5mA/cm² | EL(cd/A) @7.5mA/cm² |
|---|---|---|---|
| Ref | 4.9 | 312 | 4.2 |

[FIG. 5]

| X | V @7.5mA/cm² | L(cd/m²) @7.5mA/cm² | EL(cd/A) @7.5mA/cm² |
|---|---|---|---|
| 5 | 5.23 | 219 | 2.9 |
| 10 | 5.12 | 457 | 6.1 |
| 15 | 5.27 | 580 | 7.7 |
| 20 | 5.17 | 556 | 7.4 |
| 25 | 5.40 | 414 | 5.5 |

[FIG. 6]

| X | V @7.5mA/cm² | L(cd/m²) @7.5mA/cm² | EL(cd/A) @7.5mA/cm² |
|---|---|---|---|
| 10 | 5.05 | 415 | 5.5 |
| 15 | 5.10 | 503 | 6.7 |
| 20 | 4.88 | 455 | 6.1 |

[FIG. 7]

| X | V @7.5mA/cm² | L(cd/m²) @7.5mA/cm² | EL(cd/A) @7.5mA/cm² |
|---|---|---|---|
| 10 | 5.20 | 366 | 4.9 |
| 15 | 5.29 | 361 | 4.9 |
| 20 | 5.20 | 376 | 5.0 |

[FIG. 8]

| X | V @7.5mA/cm² | L(cd/m²) @7.5mA/cm² | EL(cd/A) @7.5mA/cm² |
|---|---|---|---|
| 10 | 4.27 | 267 | 3.6 |
| 15 | 4.46 | 269 | 3.6 |
| 20 | 4.47 | 235 | 3.3 |

[FIG. 9]
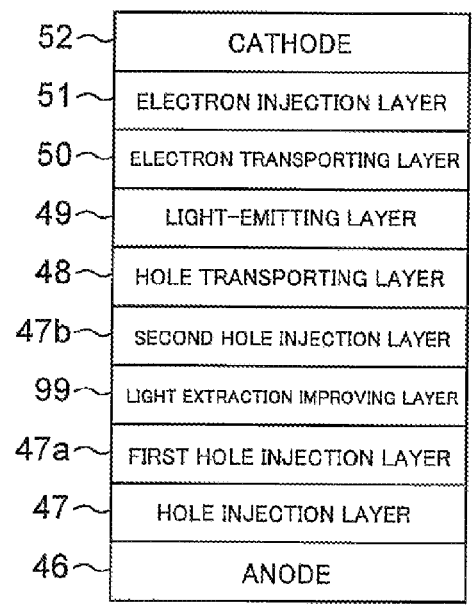
[FIG. 10]
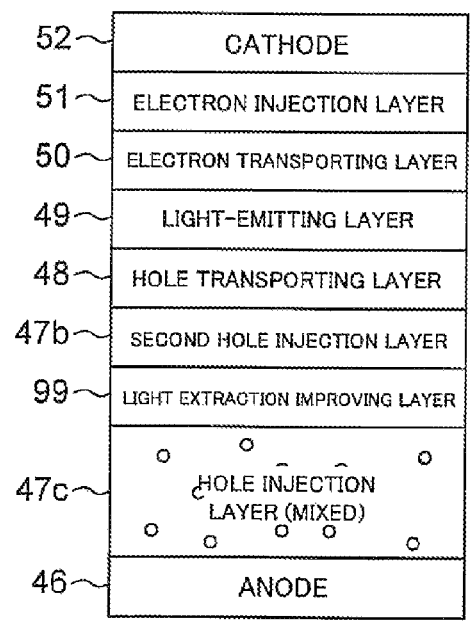

[FIG. 11]
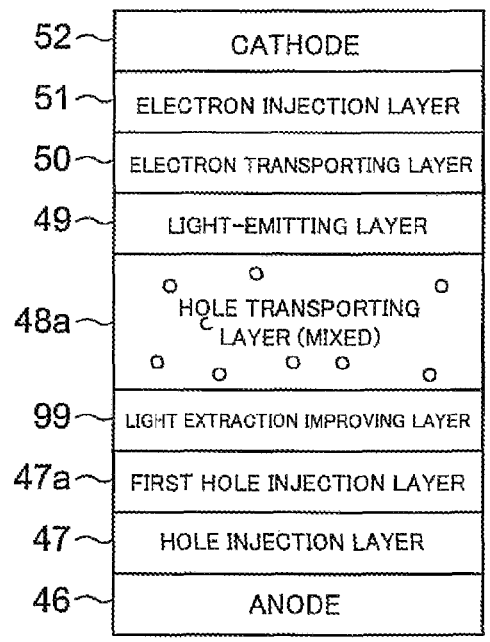
[FIG. 12]
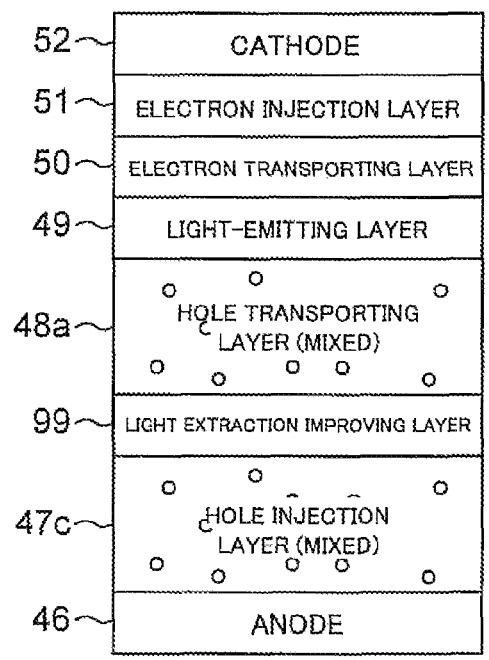

[FIG. 13]

| | |
|---|---|
| 52 | CATHODE |
| 51 | ELECTRON INJECTION LAYER |
| 99 | LIGHT EXTRACTION IMPROVING LAYER |
| 50 | ELECTRON TRANSPORTING LAYER |
| 49 | LIGHT-EMITTING LAYER |
| 48 | HOLE TRANSPORTING LAYER |
| 47 | HOLE INJECTION LAYER |
| 46 | ANODE |

[FIG. 14]

| | |
|---|---|
| 52 | CATHODE |
| 51 | ELECTRON INJECTION LAYER |
| 51a | FIRST ELECTRON INJECTION LAYER |
| 99 | LIGHT EXTRACTION IMPROVING LAYER |
| 51b | SECOND ELECTRON INJECTION LAYER |
| 50 | ELECTRON TRANSPORTING LAYER |
| 49 | LIGHT-EMITTING LAYER |
| 48 | HOLE TRANSPORTING LAYER |
| 47 | HOLE INJECTION LAYER |
| 46 | ANODE |

[FIG. 15]
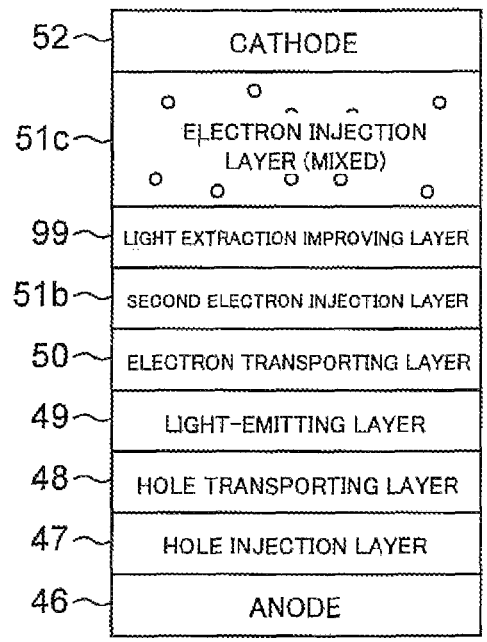
[FIG. 16]
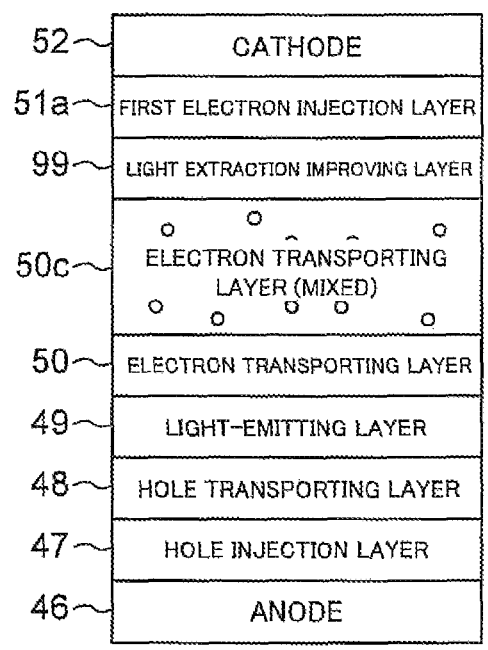

[FIG. 17]
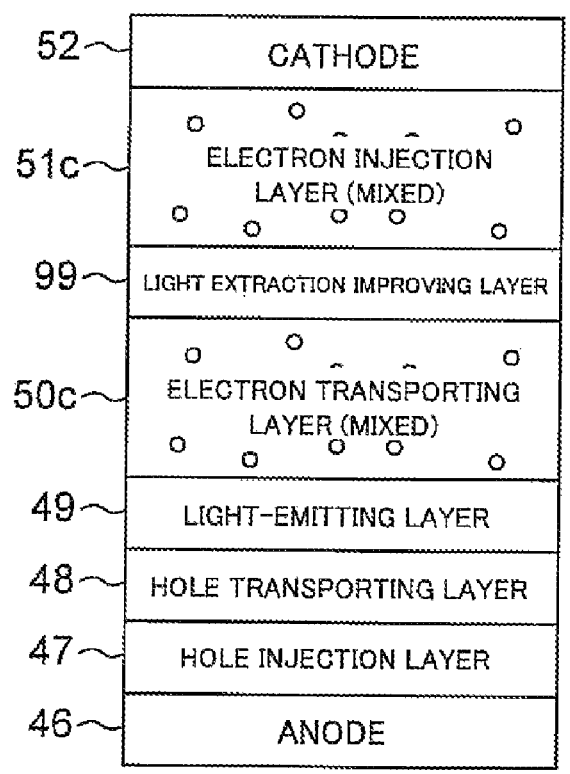

[FIG. 18]
Alq₃ 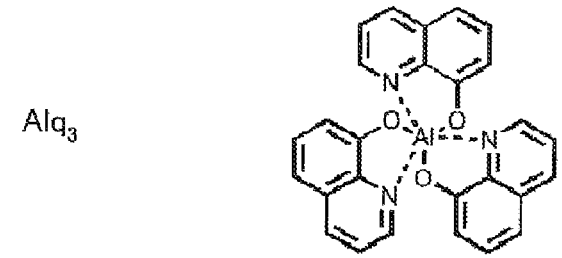
Irppy 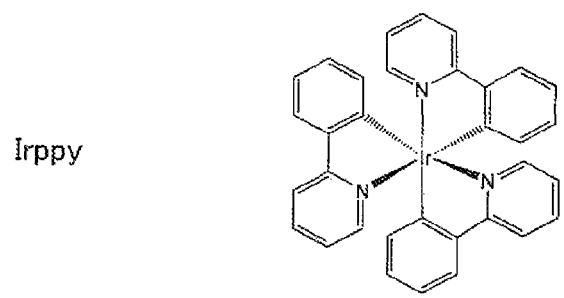
C545T 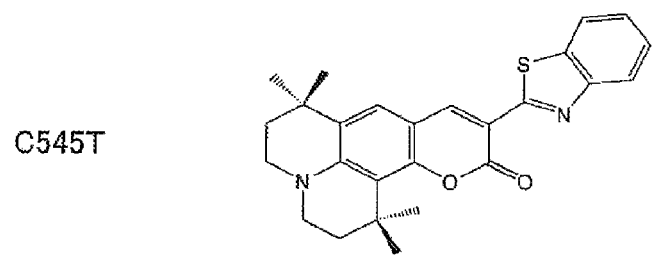
RED Ir COMPLEX 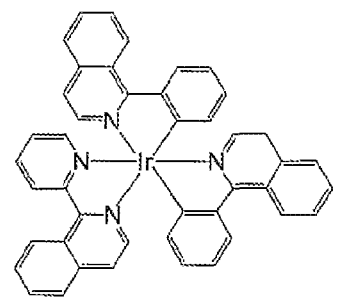
PtOEP 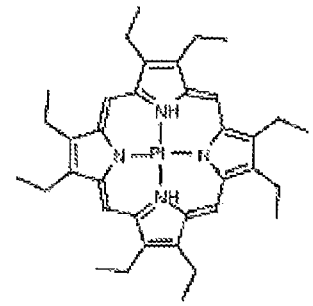

[FIG. 19]
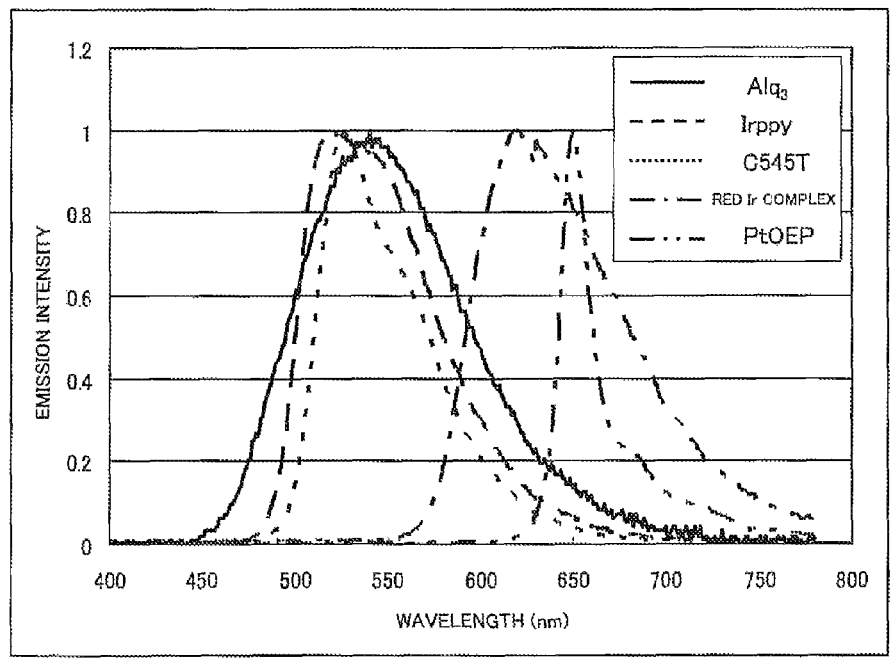
[FIG. 20]
| MATERIAL NAME | HALF WIDTH (nm) | STANDARDIZED EMISSION SPECTRUM SURFACE AREA |
|---|---|---|
| $Alq_3$ | 110 | 111 |
| Irppy | 90 | 88 |
| C545T | 65 | 67 |
| RED Ir COMPLEX | 90 | 98 |
| PtOEP | 20 | 33 |

[FIG. 21]

ITO/HIL/Ag(Xnm)/MoO$_3$(3nm)/NPB(42nm)/Alq$_3$(60nm)/Li$_2$O/Al

| Device structure | | | L (FRONT) @7.5mA/cm² | TOTAL LUMINOUS FLUX | FRONT CIE | | ΔCIE | | AMOUNT OF CHANGE (Δx²+ Δy²)^(1/2) | ASSESSMENT |
|---|---|---|---|---|---|---|---|---|---|---|
| HIL | Ag | NPB | | | x | y | Δx | Δy | | |
| CuPc (25nm) | | 45nm | 309 (1.00) | 1.00 | 0.329 | 0.575 | 0.044 | 0.002 | 0.044 | ref |
| TPA (32nm) | | 38nm | 272 (0.88) | 0.83 | 0.359 | 0.552 | 0.042 | 0.017 | 0.045 | |
| TPA(32nm) | 5nm | 42nm | 219 (0.71) | 0.71 | 0.292 | 0.58 | 0.033 | 0.018 | 0.038 | × |
| TPA(32nm) | 10nm | 42nm | 457 (1.47) | 1.28 | 0.336 | 0.560 | 0.217 | 0.001 | 0.217 | △ |
| TPA(32nm) | 15nm | 42nm | 580 (1.87) | 1.50 | 0.317 | 0.623 | 0.107 | 0.024 | 0.110 | △ |
| TPA(32nm) | 20nm | 42nm | 556 (1.79) | 1.43 | 0.292 | 0.654 | 0.108 | 0.066 | 0.127 | △ |
| TPA(32nm) | 25nm | 42nm | 414 (1.33) | 1.19 | 0.192 | 0.890 | 0.032 | 0.529 | 0.530 | △ |

[FIG. 22]

ITO/HIL/Ag/MoO$_3$(3nm)/NPB/9%Irppy:TAZ(40nm)/Alq$_3$(20nm)/Li$_2$O(10)/Al(80nm)

| Device structure | | | L (FRONT) @2.5mA/cm² | TOTAL LUMINOUS FLUX | FRONT CIE | | ΔCIE | | AMOUNT OF CHANGE (Δx²+ Δy²)^(1/2) | ASSESSMENT |
|---|---|---|---|---|---|---|---|---|---|---|
| HIL | Ag | NPB | | | x | y | Δx | Δy | | |
| CuPc (25nm) | | 45nm | 997 (1.00) | 1.00 | 0.308 | 0.635 | 0.046 | 0.021 | 0.051 | ref |
| TPA (32nm) | | 38nm | 878 (0.88) | 0.89 | 0.335 | 0.611 | 0.036 | 0.023 | 0.043 | |
| TPA(32nm) | 15nm | 37nm | 1495(1.49) | 1.30 | 0.268 | 0.669 | 0.050 | 0.003 | 0.050 | ○ |
| TPA(32nm) | 15nm | 42nm | 1616(1.61) | 1.38 | 0.295 | 0.660 | 0.081 | 0.014 | 0.082 | △ |
| TPA(32nm) | 15nm | 47nm | 1496(1.49) | 1.42 | 0.330 | 0.630 | 0.099 | 0.047 | 0.110 | △ |
| TPA(32nm) | 18nm | 37nm | 1508(1.51) | 1.21 | 0.229 | 0.697 | 0.032 | 0.032 | 0.045 | ○ |
| TPA(32nm) | 18nm | 42nm | 1671(1.67) | 1.43 | 0.279 | 0.673 | 0.095 | 0.050 | 0.107 | △ |
| TPA(32nm) | 18nm | 47nm | 1493(1.49) | 1.40 | 0.335 | 0.633 | 0.120 | 0.049 | 0.130 | △ |
| TPA(32nm) | 22nm | 37nm | 1480(1.48) | 1.20 | 0.187 | 0.719 | 0.006 | 0.058 | 0.058 | ○ |
| TPA(32nm) | 22nm | 42nm | 1712(1.72) | 1.44 | 0.246 | 0.700 | 0.073 | 0.056 | 0.092 | △ |
| TPA(32nm) | 22nm | 47nm | 1584(1.57) | 1.40 | 0.295 | 0.669 | 0.123 | 0.031 | 0.127 | △ |
| TPA(32nm) | 25nm | 42nm | 1486(1.48) | 1.25 | 0.245 | 0.705 | 0.079 | 0.024 | 0.083 | △ |
| TPA(32nm) | 30nm | 42nm | 1407(1.40) | 1.13 | 0.200 | 0.734 | 0.055 | 0.059 | 0.081 | △ |

[FIG. 23]

ITO/HIL/Ag/MoO$_3$(3nm)/NPB/C545T:Alq$_3$(0.75:2, 40nm)/Alq$_3$(20nm)/Li$_2$O(10)/Al(80nm)

| Device structure | | | L (FRONT) @7.5mA/cm² | TOTAL LUMINOUS FLUX | FRONT CIE | | ΔCIE | | AMOUNT OF CHANGE (Δx²+ Δy²)$^{1/2}$ | ASSESSMENT |
|---|---|---|---|---|---|---|---|---|---|---|
| HIL | Ag | NPB | | | x | y | Δx | Δy | | |
| CuPc (25nm) | | 45nm | 1148 (1.00) | 1.00 | 0.296 | 0.659 | 0.043 | 0.026 | 0.050 | ref |
| TPA (32nm) | | 38nm | 919 (0.80) | 0.86 | 0.333 | 0.629 | 0.032 | 0.025 | 0.041 | |
| TPA(32nm) | 15nm | 37nm | 1649(1.43) | 1.26 | 0.259 | 0.692 | 0.034 | 0.003 | 0.034 | O |
| TPA(32nm) | 15nm | 42nm | 1595(1.38) | 1.26 | 0.299 | 0.664 | 0.068 | 0.033 | 0.076 | Δ |
| TPA(32nm) | 15nm | 47nm | 1474(1.28) | 1.26 | 0.337 | 0.634 | 0.098 | 0.064 | 0.117 | Δ |
| TPA(32nm) | 20nm | 37nm | 1516(1.32) | 1.06 | 0.209 | 0.719 | 0.005 | 0.025 | 0.025 | O |
| TPA(32nm) | 20nm | 42nm | 1810(1.58) | 1.23 | 0.241 | 0.708 | 0.034 | 0.006 | 0.035 | O |
| TPA(32nm) | 20nm | 47nm | 1713(1.49) | 1.29 | 0.263 | 0.695 | 0.062 | 0.015 | 0.064 | Δ |
| TPA(32nm) | 25nm | 37nm | 1307(1.14) | 0.95 | 0.175 | 0.736 | 0.023 | 0.039 | 0.045 | O |
| TPA(32nm) | 25nm | 42nm | 1764(1.52) | 1.25 | 0.222 | 0.725 | 0.035 | 0.018 | 0.039 | O |
| TPA(32nm) | 25nm | 47nm | 1633(1.42) | 1.21 | 0.255 | 0.708 | 0.071 | 0.013 | 0.072 | Δ |

[FIG. 24]

ITO/HIL/Ag/MoO$_3$(3nm)/NPB/6% RED Ir COMPLEX : QUINOLINE DERIVATIVE (40 nm)/Alq$_3$(37.5nm)/Li$_2$O(10)/Al(80nm)

| Device structure | | | L (FRONT) @7.5mA/cm² | TOTAL LUMINOUS FLUX | FRONT CIE | | ΔCIE | | AMOUNT OF CHANGE (Δx²+ Δy²)$^{1/2}$ | ASSESSMENT |
|---|---|---|---|---|---|---|---|---|---|---|
| HIL | Ag | NPB | | | x | y | Δx | Δy | | |
| TPA (32nm) | | 55nm | 298 (1.00) | 1.00 | 0.651 | 0.344 | 0.009 | 0.007 | 0.011 | ref |
| TPA(32nm) | 20nm | 42nm | 361(1.23) | 0.54 | 0.623 | 0.376 | 0.013 | 0.005 | 0.013 | Δ |
| TPA(32nm) | 20nm | 52nm | 685(2.30) | 1.21 | 0.658 | 0.342 | 0.038 | 0.037 | 0.052 | O |
| TPA(32nm) | 20nm | 62nm | 319(1.07) | 1.43 | 0.683 | 0.317 | 0.038 | 0.039 | 0.054 | O |

[FIG. 25]

ITO/HIL/Ag/MoO$_3$(3nm)/NPB/9%PtOEP:Alq$_3$(40nm)/Alq$_3$(37.5nm)/Li$_2$O(10)/Al(80nm)

| Device structure | | | L(FRONT) @7.5mA/cm$^2$ | TOTAL LUMINOUS FLUX | FRONT CIE | | ΔCIE | | AMOUNT OF CHANGE (Δx$^2$+Δy$^2$)$^{1/2}$ | ASSESSMENT |
|---|---|---|---|---|---|---|---|---|---|---|
| HIL | Ag | NPB | | | x | y | Δx | Δy | | |
| CuPc (25nm) | | 55nm | 49 (1.00) | 1.00 | 0.712 | 0.285 | 0.012 | 0.005 | 0.013 | ref |
| TPA (32nm) | 20nm | 42nm | 70(1.43) | 0.86 | 0.714 | 0.86 | 0.041 | 0.018 | 0.045 | Δ |
| TPA(32nm) | 20nm | 52nm | 139(2.84) | 1.73 | 0.723 | 0.277 | 0.032 | 0.014 | 0.035 | O |
| TPA(32nm) | 20nm | 62nm | 109(2.20) | 2.36 | 0.726 | 0.274 | 0.013 | 0.008 | 0.015 | O |

[FIG. 26]

| LIGHT-EMITTING MATERIAL NAME | HALF WIDTH (nm) | STANDARDIZED EMISSION SPECTRUM SURFACE AREA | AMOUNT OF CHANGE IN CHROMATICITY COORDINATES (Δx$^2$+Δy$^2$)$^{1/2}$ | | |
|---|---|---|---|---|---|
| | | | MICRO-CAVITY STRUCTURE | NO MICRO-CAVITY STRUCTURE | |
| | | | | TPA | CuPc |
| Alq$_3$ | 110 | 111 | 0.127 | 0.045 | 0.044 |
| Irppy | 90 | 88 | 0.092 | 0.043 | 0.051 |
| C545T | 65 | 67 | 0.035 | 0.041 | 0.050 |
| RED Ir COMPLEX | 90 | 98 | 0.052 | 0.011 | ND |
| PtOEP | 20 | 33 | 0.035 | ND | 0.013 |

[FIG. 27]
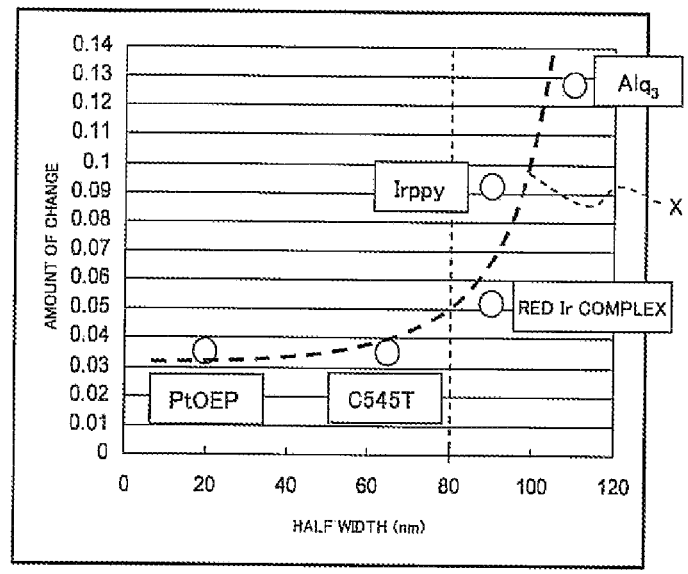
[FIG. 28]
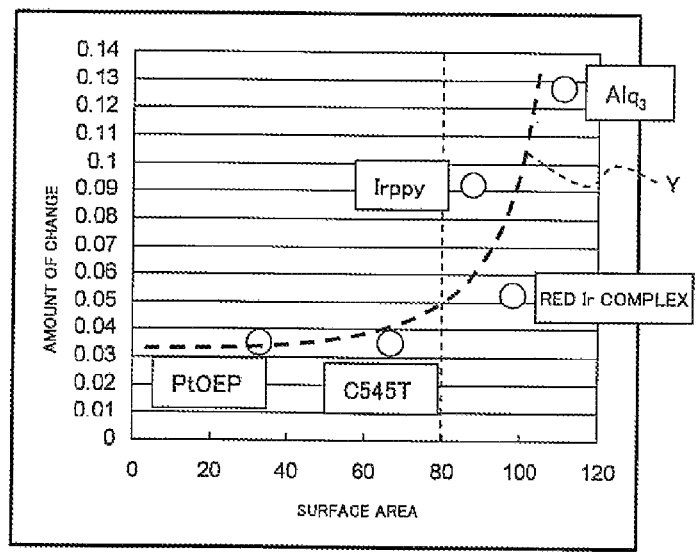

[FIG. 29]
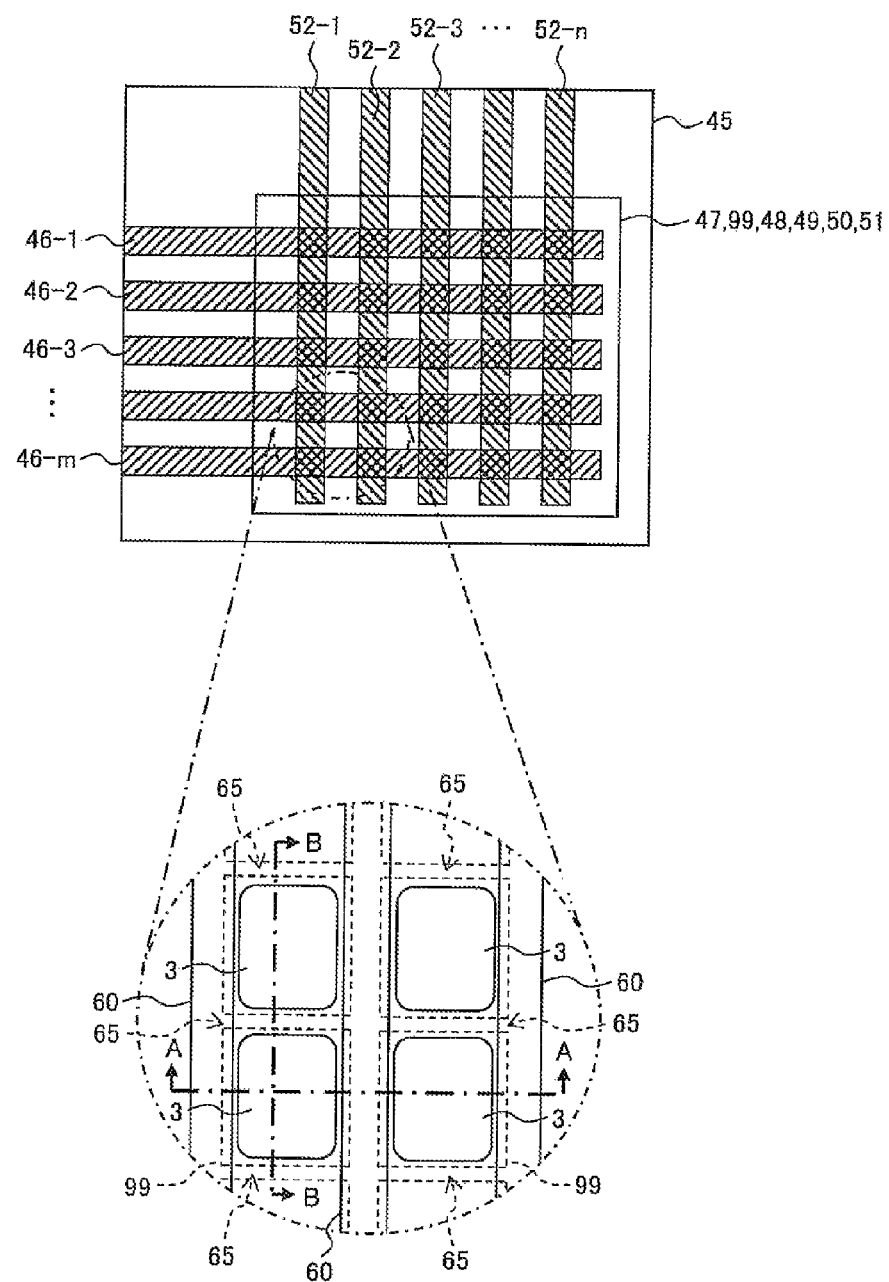

[FIG. 30]
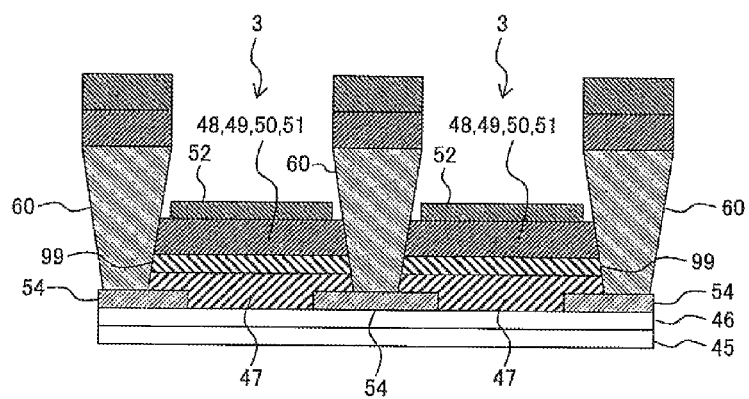
[FIG. 31]
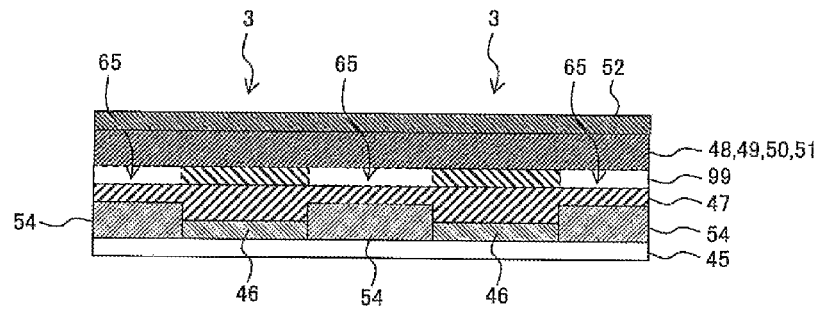

[FIG. 32]
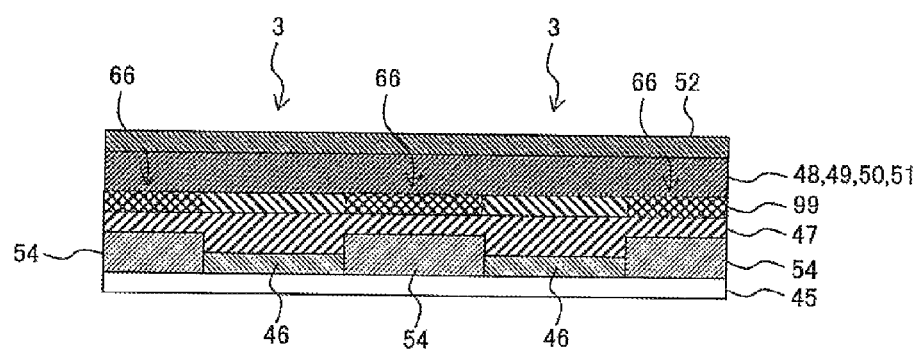

LIGHT-EMITTING ELEMENT AND DISPLAY PANEL

CROSS-REFERENCE TO RELATED APPLICATION

This is an application PCT/JP2008/072065, filed Dec. 4, 2008, which was not published under PCT article 21(2) in English.

BACKGROUND OF THE INVENTION

1. Field of the Invention

The present invention relates to a light-emitting device and the like that causes a light-emitting layer to emit light in accordance with an applied voltage provided between a pair of electrodes.

2. Description of the Related Art

In recent years, there has been a tremendous amount of development in the type of flat panel display called the organic electroluminescent (hereinafter abbreviated "EL") display, which utilizes organic EL phenomena to display images.

The organic EL display is a self-luminous light-emitting display that utilizes the luminous phenomena of the organic electroluminescent device to display images, making it possible to achieve a thin display that is light in weight and offers a wide viewing angle and low power consumption. The organic electroluminescent device forms an organic semiconductor layer between two electrodes, and a light-emitting layer on a part of this organic semiconductor layer (refer to JP, A, 2007-12369).

In the organic EL display of prior art, the light generated by the light-emitting layer inside each organic electroluminescent device is guided in the substrate and the organic semiconductor layer in the direction (horizontal direction) in which that layer extends, at a percentage of approximately 80%. As a result, the organic electroluminescent device of prior art has a light extraction efficiency in the frontal direction of the organic display of only approximately 20% in general, resulting in poor light extraction efficiency and difficulties in increasing luminance.

In consequence, there have been known prior art organic electroluminescent devices that provide within the organic semiconductor layer a functional layer (hereinafter "light extraction improving layer") designed to improve the light extraction efficiency from the light-emitting layer [refer to JP, A, 2008-28371 and JP, A, 2008-59905]. Such prior art discloses a configuration in which a light extraction improving layer that contains at least Ag in part as a component is formed adjacent to a transparent electrode.

While the prior art described in the above JP, A, 2008-28371 and JP, A, 2008-59905 discloses a configuration wherein a light extraction improving layer containing at least Ag in part as a component is formed adjacent to a transparent electrode, the value of the refractive index n of the transparent electrode in this case is approximate 2.0 or higher which is large, thereby minimizing any gain in emission intensity since light, by its very nature, is guided in the direction of the higher refractive index n. In particular, with the large difference between the refractive indices of the transparent electrode and the Ag layer, the above guidance characteristics occur to a significant degree.

SUMMARY OF THE INVENTION

The above-described problem is given as an example of the problems that are to be solved by the present invention.

Means for Solving the Problem

In order to achieve the above-described subject, according to the invention of claim 1, there is provided a light-emitting device comprising: a transparent or semitransparent first electrode; a second electrode that forms a pair with the first electrode and reflects light; and an organic semiconductor layer comprising a photoelectric converting layer that emits light by recombining holes removed from one of the first electrode and the second electrode with electrons removed from the other of the first electrode and the second electrode; wherein: the organic semiconductor layer comprises: between the first electrode and the photoelectric converting layer a light extraction improving layer that contains at least silver or gold in part as a component, partially reflects light, and has transparency; a hole injection layer that is formed on one of the first electrode and the second electrode and facilitates the removal of holes from the one electrode; a hole transporting layer that transports holes removed by the hole injection layer to the photoelectric converting layer; an electron injection layer that facilitates the removal of electrons from the other of the first electrode and the second electrode; and an electron transporting layer that transports electrons removed by the electron injection layer to the photoelectric converting layer, wherein the light extraction improving layer is formed between the hole injection layer and the hole transporting layer.

In order to achieve the above-described subject, according to the invention of claim 10, there is provided a display panel wherein each pixel is made of a light-emitting device, the light-emitting device comprising: a transparent or semitransparent first electrode; a second electrode that forms a pair with the first electrode and reflects light; and an organic semiconductor layer comprising a photoelectric converting layer that emits light by recombining holes removed from one of the first electrode and the second electrode with electrons removed from the other of the first electrode and the second electrode; wherein: the organic semiconductor layer comprises: between the first electrode and the photoelectric converting layer a light extraction improving layer that contains at least silver or gold in part as a component, partially reflects light, and has transparency; a hole injection layer that is formed on one of the first electrode and the second electrode and facilitates the removal of holes from the one electrode; a hole transporting layer that transports holes removed by the hole injection layer to the photoelectric converting layer; an electron injection layer that facilitates the removal of electrons from the other of the first electrode and the second electrode; and an electron transporting layer that transports electrons removed by the electron injection layer to the photoelectric converting layer, wherein the light extraction improving layer is formed between the hole injection layer and the hole transporting layer.

BRIEF DESCRIPTION OF THE DRAWING

FIG. 1 is a partial cross-sectional view illustrating an example of a case where a light-emitting device of the embodiment is applied to an organic electroluminescent device of a display panel.

FIG. 2 is a cross-sectional image illustrating an example of the optical paths within the organic electroluminescent device of FIG. 1.

FIG. 3 is a table illustrating an example of light extraction efficiency as comparison example 1 used to verify the effect of the embodiment.

FIG. 4 is a table illustrating an example of light extraction efficiency as comparison example 2 used to verify the effect of the embodiment.

FIG. 5 is a table illustrating an example of the light extraction efficiency corresponding to the thickness of the light extraction improving layer.

FIG. 6 is a table illustrating an example of the light extraction efficiency corresponding to the thickness of the light extraction improving layer.

FIG. 7 is a table illustrating an example of the light extraction efficiency corresponding to the thickness of the light extraction improving layer.

FIG. 8 is a table illustrating an example of the light extraction efficiency corresponding to the thickness of the light extraction improving layer.

FIG. 9 is a cross-sectional view illustrating an exemplary modification of the organic electroluminescent device of the embodiment.

FIG. 10 is a cross-sectional view illustrating an exemplary modification of the organic electroluminescent device of the embodiment.

FIG. 11 is a cross-sectional view illustrating an exemplary modification of the organic electroluminescent device of the embodiment.

FIG. 12 is a cross-sectional view illustrating an exemplary modification of the organic electroluminescent device of the embodiment.

FIG. 13 is a cross-sectional view illustrating an exemplary modification of the organic electroluminescent device of the embodiment.

FIG. 14 is a cross-sectional view illustrating an exemplary modification of the organic electroluminescent device of the embodiment.

FIG. 15 is a cross-sectional view illustrating an exemplary modification of the organic electroluminescent device of the embodiment.

FIG. 16 is a cross-sectional view illustrating an exemplary modification of the organic electroluminescent device of the embodiment.

FIG. 17 is a cross-sectional view illustrating an exemplary modification of the organic electroluminescent device of the embodiment.

FIG. 18 is a diagram illustrating the chemical structural formulas of each of the five types of light-emitting materials constituting the light-emitting layer.

FIG. 19 is a diagram illustrating examples of the emission spectrums of each of the five types of light-emitting materials constituting the light-emitting layer.

FIG. 20 is a table indicating examples of the half widths of the emission spectrum and the standardized emission spectrum surface areas of each of the five types of light-emitting materials constituting the light-emitting layer.

FIG. 21 is a table showing an example of the luminance, total luminous flux, and amount of change in CIE chromaticity coordinates when $Alq_3$ is used as the light-emitting material.

FIG. 22 is a table showing an example of the luminance, total luminous flux, and amount of change in CIE chromaticity coordinates when Irppy is used as the light-emitting material.

FIG. 23 is a table showing an example of the luminance, total luminous flux, and amount of change in CIE chromaticity coordinates when C545T is used as the light-emitting material.

FIG. 24 is a table showing an example of the luminance, total luminous flux, and amount of change in CIE chromaticity coordinates when red Ir complex is used as the light-emitting material.

FIG. 25 is a table showing an example of the luminance, total luminous flux, and amount of change in CIE chromaticity coordinates when PtOEP is used as the light-emitting material.

FIG. 26 is a table showing examples of the half width of the emission spectrum, the standardized emission spectrum surface area, and the amount of change in chromaticity coordinates of the measurement results of the five types of light-emitting materials constituting the light-emitting layer.

FIG. 27 is a diagram illustrating an example of the relationship between half width and the amount of change in chromaticity coordinates, based on the measurement results indicated in FIG. 26.

FIG. 28 is a diagram illustrating an example of the relationship between emission spectrum surface area and the amount of change in chromaticity coordinates, based on the measurement results indicated in FIG. 26.

FIG. 29 is a diagram illustrating a conceptual configuration example of a display panel to which the organic electroluminescent device is applied, and a partially enlarged view of a section thereof.

FIG. 30 is a cross-sectional view illustrating an example of the cross-section along line A-A in FIG. 29.

FIG. 31 is a cross-sectional view illustrating an example of the cross-section along line B-B in FIG. 29.

FIG. 32 is a cross-section view illustrating an example of the cross-section along line B-B in FIG. 29 in a case where a resistance increasing portion is provided to the light extraction improving layer.

DETAILED DESCRIPTION OF THE PREFERRED EMBODIMENTS

The following describes an embodiment of the present invention with reference to accompanying drawings.

FIG. 1 is a partial cross-sectional view illustrating an example of a case where a light-emitting device of this embodiment is applied to an organic electroluminescent device 3 of a display panel. Note that the thickness of each layer is simplified for clarity of disclosure, and is not limited thereto.

The organic electroluminescent device 3 is an example of an organic semiconductor device, and is formed correspondingly for each of the colors red, green, and blue, for example. The organic electroluminescent device 3 shown in the figure constitutes one pixel.

The organic electroluminescent device 3 is a bottom-emission type organic electroluminescent device, for example, with one device formed correspondingly for each pixel of the colors red, green, and blue, for example. This organic electroluminescent device 3 is structured so that an anode 46, a hole injection layer 47, a light extraction improving layer 99, a hole transporting layer 48, a light-emitting layer 49, an electron transporting layer 50, an electron injection layer 51, and a cathode 52 are layered in that order on a glass substrate 45. Note that this organic electroluminescent device 3 may employ a structure in which is layered an electric charge and exciter diffusion layer for capturing an electric charge and exciter within the light-emitting layer 49.

An emission area confining layer 54 for confining the light-emitting area of one pixel is formed between the adjacent organic electroluminescent devices 3 on the anode 46. This emission area confining layer 54 is made of an insulating material.

The glass substrate 45 is formed by a transparent, semi-transparent, or non-transparent material. The anode 46 is equivalent to a first electrode and is formed so that it covers the area along the glass substrate 45. This anode 46 has a function of supplying holes to the light-emitting layer 49 described later. The anode 46 is a metal electrode made mainly of indium tin oxide (ITO) in this embodiment. Note that the anode 46 may employ materials other than ITO, such as Au, Ag, Cu, or indium zinc oxide (IZO), or alloys thereof, for example. Further, the anode 46 may also employ materials such as Al, Mo, Ti, Mg, or Pt.

The hole injection layer 47 has a function of facilitating the removal of holes from the anode 46. The hole injection layer 47 is not particularly limited as a positive hole injection layer, allowing suitable use of metal phthalocyanines such as copper phthalocyanine, metal-free phthalocyanines, carbon films, and polymers that conduct electricity such as polyaniline, for example. The above-described hole transporting layer 48 has a function of transporting the holes removed from the anode 46 by the hole injection layer 47 to the light-emitting layer 49. The hole transporting layer 48 includes as an organic compound having positive hole transportability, for example, N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostilbenzene, N-phenylcarbazole, 1,1-bis(4-di-p-triaminophenyl)-cyclohexane, 1,1-bis(4-di-p-triaminophenyl)-4-phenylcyclohexane, bis(4-dimethylamino-2-methylphenyl)-phenylmethane, N,N,N-tri(p-tolyl)amine, 4-(di-p-tolylamino)-4'-[4(di-p-tolylamino)styryl]stilbene, N,N,N',N'-tetra-p-tolyl-4,4'-diamino-biphenyl, N,N,N',N'-tetraphenyl-4,4'-diamino-biphenyl N-phenylcarbazole, 4,4'-bis[N-(1-naphthyl)-N-phenyl-amino]biphenyl, 4,4"-bis[N-(1-naphthyl)-N-phenyl-amino]p-terphenyl, 4,4'-bis[N-(2-naphthyl)-N-phenyl-amino]biphenyl, 4,4'-bis[N-(3-acenaphthenyl)-N-phenyl-amino] biphenyl, 1,5-bis[N-(1-naphthyl)-N-phenyl-amino] naphthalene, 4,4'-bis[N-(9-anthryl)-N-phenyl-amino] biphenyl, 4,4"-bis[N-(1-anthryl)-N-phenyl-amino]p-terphenyl, 4,4'-bis[N-(2-phenanthryl)-N-phenyl-amino] biphenyl, 4,4'-bis[N-(8-fluoranthenyl)-N-phenyl-amino] biphenyl, 4,4'-bis[N-(2-pyrenyl)-N-phenyl-amino]biphenyl, 4,4'-bis[N-(2-perylenyl)-N-phenyl-amino]biphenyl, 4,4'-bis[N-(1-coronenyl)-N-phenyl-amino]biphenyl, 2,6-bis(di-p-tolylamino)naphthalene, 2,6-bis [di-(1-naphthyl)amino] naphthalene, 2,6-bis[N-(1-naphthyl)-N-(2-naphthyl)amino] naphthalene, 4,4"-bis[N,N-di(2-naphthyl)amino]terphenyl, 4,4'-bis{N-phenyl-N-[4-(1-naphthyl)phenyl] amino}biphenyl, 4,4'-bis[N-phenyl-N-(2-pyrenyl)-amino] biphenyl, 2,6-bis[N,N-di(2-naphthyl)amino]fluorene, 4,4"-bis(N,N-di-p-tolylamino)terphenyl, bis(N-1-naphthyl)(N-2-naphthyl)amine, etc. This hole transporting material is also a material capable of functioning as a hole injection layer as well.

The light extraction improving layer 99 is formed between the hole injection layer 47 and the hole transporting layer 48. The light extraction improving layer 99 contains at least silver or gold in part as a component, for example, and partially reflects light and has transparency. The details of the light extraction improving layer 99 will be described later.

While the hole transporting layer 48 is formed between the hole injection layer 47 and the light-emitting layer 49, and its material NPB is generally a hole-transportable material having hole moveability, in this embodiment the material exhibits the function of an emission efficiency improving or emission efficiency reduction suppressing layer.

The above-described light-emitting layer 49 is equivalent to the photoelectric converting layer, and is a light-emitting device that is made of an organic material, for example, and employs a so-called electroluminescence (EL) phenomenon. The light-emitting layer 49 is layered between any of the plurality of electrodes 46 and 52, and has a function of emitting light by an electric field generated between the plurality of electrodes 46 and 52 by an applied voltage. This light-emitting layer 49 outputs its own light by utilizing a phenomenon in which light is emitted based on energy received from an external source using an electric field.

The electron transporting layer 50 is formed between the light-emitting layer 49 and the electron injection layer 51. The electron transporting layer 50 efficiently transports the electrons removed from the cathode 52 by the electron injection layer 51 to the light-emitting layer 49. Possible organic compounds having electron transportability that serve as a main component of the light-emitting layer 49 and the electron transportable organic semiconductor layer include, for example, polycyclic compounds such as p-terphenyls, quarterphenyls, and derivatives thereof; condensed polycyclic hydrocarbon compounds such as naphlathene, tetracene, pyrene, coronene, chrysene, anthracene, diphenylanthracene, naphthacene, phenanthrene, and derivatives thereof; condensed heterocyclics such as phenanthroline, bathophenanthroline, phenanthridine, acridine, quinoline, quinoxaline, phenazine, and derivatives thereof; and fluorothene, perylene, phthaloperylene, naphthaloperylene, perinone, phthaloperinone, naphthaloperinone, diphenylbutadiene, tetraphenylbutadiene, oxadiazole, aldazine, bisbenzoxazolene, bisstyryl, pyrazine, cyclopentadiene, auxin, aminoquinoline, imine, diphenylethylene, vinylanthracene, diaminocarbazole, pyran, thiopyran, polymethine, merocyanine, quinacridone, rubrene, and derivatives thereof. Possible metal chelate complex compounds, particularly metal chelate auxanoid compounds, include metal complexes having as a ligand at least one of 8-quinolinolatos, such as tris(8-quinolinolato) aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato) aluminum, 8-quinolinolatolithium, tris(5-chloro-8-quinolinolato)gallium, bis(5-chloro-8-quinolinolato)calcium, and derivatives thereof.

Additionally, oxadiazoles, trizines, stilbene derivatives, distyryl arylene derivatives, styryl derivatives, and diolefin derivatives can be suitably used as an organic compound having electron transportability.

Furthermore, possible organic compounds that can be used as an organic compound having electron transportability include benzoxazoles such as 2,5-bis(5,7-di-t-bentyl-2-benzoxazolyl)-1,3,4-thiazole, 4,4'-bis(5,7-t-pentyl-2-benzoxaxolyl)stilbene, 4,4'-bis[5,7-di-(2-methyl-2-butyl)-2-benzoxazolyl]stilbene, 2,5-bis(5,7-di-t-pentyl-2-benzoxazolyl) thiophen, 2,5-bis[5-(α,α-dimethylbenzole)-2-benzoxazolyl] thiophen, 2,5-bis[5,7-di-(2-methyl-2-butyl)-2-benzoxazolyl]-3,4-diphenylthiophene, 2,5-bis(5-methyl-2-benzoxazolyl)theophene, 4,4'-bis(2-benzoxazolyl)biphenyl, 5-methyl-2-{2-[4-(5-methyl-2-benzoxazolyl)phenyl] vinyl}benzoxazole, 2-[2-(4-chlorophenyl)vinyl]naphtha(1, 2-d)oxazole; benzothiazoles such as 2,2-(p-phenylenedipyrine)-bisbenzothiazole; and 2-{2-[4-(2-benzimidazolyl) phenyl]vinyl}benzimidazole, 2-[2-(4-carboxyphenyl)vinyl] benzimidazole.

Furthermore, possible organic compounds having electron transportability include 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene, 1,4-bis(2-methylstyryl)-2-ethylbenzene.

Furthermore, possible organic compounds having electron transportability include 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, 2,5-bis[2-(1-pyrenyl)vinyl]pyrazine.

Other possible organic compounds having electron transportability that are suitable for use include known compounds used in the manufacture of prior art organic EL devices, such as 1,4-phenylenedimethylidene, 4,4'-phenylenedimethylidene, 2,5-xylylenedimethylidene, 2,6-naphthylenedimethylidene, 1,4-biphenylenedimethylidene, 1,4-p-terphenylenedimethylidene, 9,10-anthracenedimethylidene, 4,4'-(2,2-di-t-butylphenylvinyl)biphenyl, 4,4'-(2,2-diphenylvinyl)biphenyl.

The electron injection layer 51 is stacked on the light-emitting layer 49. This electron injection layer 51 has a function of facilitating the removal of electrons from the cathode 52. The cathode 52 is formed on the electron injection layer 51. Note that the electron injection layer 51 may also include a function of a buffer layer or the cathode 52. In the organic electroluminescent device 3, the light-emitting layer 49 outputs light by an electric field in accordance with the voltage applied between the anode 46 and the cathode 52.

In the organic electroluminescent device 3 of this embodiment, the light-emitting layer 49 mainly emits a light L (external light) downward in the case of a bottom-emission type, for example, but in actuality also emits the light L in unintended directions, such as shown on the right side in the example. In a case where the organic electroluminescent device 3 is designed with a configuration in which the above-described light extraction improving layer 99 does not exist, a part of the light L emitted by the light-emitting layer 49 is not extracted to the outside of the organic electroluminescent device 3 as external light and tends to get lost within the organic electroluminescent device 3. In this embodiment, the light from the light L thus emitted by the light-emitting layer 49 and not removable as external light is referred to as "internal light."

FIG. 2 is a cross-sectional image illustrating an example of the optical paths within the organic electroluminescent device 3 of FIG. 1. While a gap exists between each layer in the figure, this gap is provided to make the figure easier to view and does not actually exist. Additionally, the organic semiconductor layer in the claims represents the hole injection layer 47, the hole transporting layer 48, the light-emitting layer 49, the electron transporting layer 50, or the electron injection layer 51, for example, or any combination thereof.

The organic semiconductor layer contains in part metal, such as silver or silver alloy, in the above-described light extraction improving layer 99, for example. That is, the light extraction improving layer 99 contains silver, silver alloy, or silver particles, for example. The light extraction improving layer 99 may also be a thin film of silver or silver alloy, for example. Note that this metal is not limited to silver, allowing use of gold, for example.

In the organic electroluminescent device 3, the light-emitting layer 49 outputs light in various directions, including the directions along the anode 46, the cathode 52, and the light-emitting layer 49, according to the recombining of the holes and electrons. Given an illustrative scenario of an organic electroluminescent device employing a general configuration, the amount of light propagated in the transverse direction within the organic semiconductor, such as that of the electron injection layer 51, the electron transporting layer 50, the light-emitting layer 49, the hole transporting layer 48, and the hole injection layer 47, is approximately 40% in the general organic electroluminescent device. The transverse direction here corresponds to the direction along the light-emitting layer 49. In the light-emitting layer 49, light such as described below is generated at a luminous point 49a.

Light Emission 1

Light emission 1 represents normal light emission such as the light emission illustrated on the left side in the figure. A luminescent line L emitted to the anode 46 side is transmitted through the light extraction improving layer 99 and the anode 46 having transparency, and outputted to the outside of the organic electroluminescent device 3. The luminescent line L here is equivalent to the above-described light L. On the other hand, the luminescent line L emitted to the cathode 52 side is reflected by the cathode 52, transmitted through the light-emitting layer 49, the light extraction improving layer 99, and the anode 46, and outputted to the outside of the organic electroluminescent device 3.

Light Emission 2

Light emission 2 represents light emission that utilizes a micro-cavity effect and multiple reflection interference effect, such as illustrated in the center. Here, only the points that differ from that of the aforementioned light emission 1 will be described. In light emission 2, the luminescent line L emitted to the anode 46 side is reflected by the hole transporting layer 48, returns to the cathode 52 side, is reflected by the cathode 52, travels once again toward the anode 46, and is outputted to the outside of the organic electroluminescent device 3.

Light Emission 3

With light emission 3, the luminescent line L emitted toward the anode 46 side and in the direction somewhat along the light-emitting layer 49 tends to disappear within the prior art organic electroluminescent device employing a general configuration, but in the organic electroluminescent device 3 scatters in accordance with the surface roughness of the above-described light extraction improving layer 99 and is outputted to the outside of the organic electroluminescent device 3 from the anode 46. The organic electroluminescent device 3 enhances light extraction efficiency with its light extraction improving layer 99 provided to the light-emitting layer 49, thereby increasing the amount of luminescence in general. When the refractive index of each layer is set as described above, the light propagation in the transverse direction is suppressed, making it possible to further improve the light extraction efficiency.

Verification of Light Extraction Efficiency

FIG. 3 is a table illustrating an example of the light extraction efficiency of comparison example 1 used to verify the effect of the embodiment. In comparison example 1, the light extraction improving layer 99 is not provided.

In the example shown in FIG. 3, the anode 46, the hole injection layer 47, the hole transporting layer 48, the light-emitting layer 49, the electron transporting layer 50, the electron injection layer 51, and the cathode 52 are made of the following materials, respectively (note that the slash mark indicates the separation between each layer): ITO/triphenylamine derivative layer (32 nm)/NPB (38 nm)/Alq$_3$ (60 nm)/Li$_2$O/Al. In this case, Alq$_3$ is a light-emitting layer having electron transportability, and the light-emitting layer 49 and the electron transporting layer 50 are combined (hereinafter the same). The values within parentheses indicate the film thickness of each layer.

The refractive index n of each layer is 1.7-1.8 for the hole injection layer 47, 1.7-1.8 for the light-emitting layer 49, and 1.7-1.8 for the hole transporting layer 48. In this comparison example, a driving voltage V is 4.50 [V], a luminance L is 274 [cd/m$^2$], and a current efficiency EL is 3.7 [cd/A].

FIG. 4 is a table illustrating an example of the light extraction efficiency of comparison example 2 used to verify the effect of the embodiment. In comparison example 2, the hole injection layer 47 and the light extraction improving layer 99 are not provided.

In the example shown in FIG. 4, the anode 46, the hole transporting layer 48, the light-emitting layer 49, the electron transporting layer 50, the electron injection layer 51, and the cathode 52 are made of the following materials, respectively (note that the slash mark indicates the separation between each layer): ITO/NPB (42 nm)/Alq$_3$ (60 nm)/Li$_2$O/Al. The values within parentheses indicate the film thickness of each layer. In comparison example 2, the driving voltage V is 4.9 [V], the luminance L is 312 [cd/m$^2$], and the current efficiency EL is 4.2 [cd/A].

FIG. 5 is a table illustrating an example of the light extraction efficiency corresponding to the thickness of the light extraction improving layer 99.

In the example shown in FIG. 5, the anode 46, the hole injection layer 47, the light extraction improving layer 99, the hole transporting layer 48, the light-emitting layer 49, the electron transporting layer 50, the electron injection layer 51, and the cathode 52 are made of the following materials, respectively (note that the slash mark indicates the separation between each layer): ITO/triphenylamine derivative layer (32 nm)/Ag (X nm)/MoO$_3$ (3 nm)/NPB (42 nm)/Alq$_3$ (60 nm)/Li$_2$O/Al. In this case, MoO$_3$ (although not particularly shown in the layered configuration illustrated in the aforementioned FIG. 2) is provided adjacent to Ag, which is the light extraction improving layer 99, and is a functional layer having the function of augmenting the charge injection wall of the light extraction improving layer 99 and the other adjacent organic semiconductor layers 47-51, etc., and alleviating the increase in the driving voltage of the device (hereinafter the same). The values within parentheses indicate the film thickness of each layer.

The refractive index n of each layer is 1.7-1.8 for the hole injection layer 47, approximately 0.2 for the light extraction improving layer 99, 1.7-1.8 for the light-emitting layer 49, and 1.7-1.8 for the hole transporting layer 48. The current density in the verification example of this embodiment is, for example, 7.5 [mA/cm$^2$].

In a case where the thickness of the light extraction improving layer 99 is 15 nm, for example, the driving voltage V is 5.27 [V], the luminance L is 580 [cd/m$^2$], and the current efficiency EL is 7.7 [cd/A]. In this verification example, the light extraction efficiency is greatest when the thickness of the light extraction improving layer 99 is 15 [nm]. This arrangement makes it possible to improve the light extraction efficiency in comparison with comparison example 1 and comparison example 2.

FIG. 6 is a table illustrating an example of the light extraction efficiency corresponding to the thickness of the light extraction improving layer 99.

In the example shown in FIG. 6, the anode 46, the hole injection layer 47, the light extraction improving layer 99, the hole transporting layer 48, the light-emitting layer 49, the electron transporting layer 50, the electron injection layer 51, and the cathode 52 are made of the following materials, respectively (note that the slash mark indicates the separation between each layer): ITO/40%-MoO$_3$: triphenylamine derivative mixed layer (32 nm)/Ag (X nm)/MoO$_3$ (3 nm)/NPB (42 nm)/Alq$_3$ (60 nm)/Li$_2$O/Al. Here, "40%-MoO$_3$: triphenylamine derivative mixed layer" refers to a layer that has 40% MoO$_3$ mixed with TPT-1 (triphenylamine derivative). The values within parentheses indicate the film thickness of each layer.

The refractive index n of each layer is greater than 2.0 for the hole injection layer 47, approximately 0.2 for the light extraction improving layer 99, 1.7-1.8 for the light-emitting layer 49, and 1.7-1.8 for the hole transporting layer 48. Note that each of the organic semiconductor layers, such as the electron injection layer 51, the electron transporting layer 50, the light-emitting layer 49, the hole transporting layer 48, and the hole injection layer 47, preferably has as low of a refractive index n as possible.

In a case where the thickness of the light extraction improving layer 99 is 15 nm, for example, the driving voltage V is 5.10 [V], the luminance L is 503 [cd/m$^2$], and the current efficiency EL is 6.7 [cd/A]. In this verification example, the light extraction efficiency is greatest when the thickness of the light extraction improving layer 99 is 15 [nm]. This arrangement makes it possible to improve the light extraction efficiency in comparison with comparison example 1 and comparison example 2.

FIG. 7 is a table illustrating an example of the light extraction efficiency corresponding to the thickness of the light extraction improving layer 99.

In the example shown in FIG. 7, the anode 46, the hole injection layer 47, the light extraction improving layer 99, the hole transporting layer 48, the light-emitting layer 49, the electron transporting layer 50, the electron injection layer 51, and the cathode 52 are made of the following materials, respectively (note that the slash mark indicates the separation between each layer): ITO/triphenylamine derivative layer (32 nm)/Au (X nm)/MoO$_3$ (3 nm)/NPB (42 nm)/Alq$_3$ (60 nm)/Li$_2$O/Al. The values within parentheses indicate the film thickness of each layer.

The refractive index n of each layer is 1.7-1.8 for the hole injection layer 47, approximately 0.6 for the light extraction improving layer 99, 1.7-1.8 for the light-emitting layer 49, and 1.7-1.8 for the hole transporting layer 48. In this example, the refractive indices decrease along with the decrease in the reflectance of the light extraction improving layer 99 compared to the examples already described.

In a case where the thickness of the light extraction improving layer 99 is 15 nm, for example, the driving voltage V is 5.29 [V], the luminance L is 361 [cd/m$^2$], and the current efficiency EL is 4.9 [cd/A]. In this verification example, the light extraction efficiency is greatest when the thickness of the light extraction improving layer 99 is 20 [nm]. This arrangement makes it possible to improve the light extraction efficiency in comparison with comparison example 1 and comparison example 2.

FIG. 8 is a table illustrating an example of the light extraction efficiency corresponding to the thickness of the light extraction improving layer 99.

In the example shown in FIG. 8, a second hole injection layer is provided between the light extraction improving layer 99 and the hole transporting layer 48 in addition to the layered configuration illustrated in the aforementioned FIG. 2. That is, the anode 46, the hole injection layer 47, the light extraction improving layer 99, the second hole injection layer, the hole transporting layer 48, the light-emitting layer 49, the electron transporting layer 50, the electron injection layer 51, and the cathode 52 are made of the following materials, respectively (note that the slash mark indicates the separation between each layer): ITO/triphenylamine derivative layer (32 nm)/Ag (X nm)/40%-MoO$_3$: triphenylamine derivative mixed layer (28 nm)/NPB (10 nm)/Alq$_3$ (60 nm)/Li$_2$O/Al. The values within parentheses indicate the film thickness of each layer.

The refractive index n of each layer is 1.7-1.8 for the hole injection layer 47, approximately 0.2 for the light extraction improving layer 99, greater than 2.0 for the second hole injection layer, 1.7-1.8 for the light-emitting layer 49, and 1.7-1.8 for the hole transporting layer 48. That is, in this example, of the two hole injection layers on either side of the light extraction improving layer 99, the second hole injection layer, which is on the cathode 52 side, has a refractive index n that is greater than that of the hole injection layer 47 on the anode 46 side. As a result, even in a case where the thickness of the light extraction improving layer 99 is 10, 15, or 20 nm, the light extraction efficiency is low compared to comparison example 1 and comparison example 2.

Note that the embodiments of the present invention are not limited to the above, and various modifications are possible. In the following, details of such modifications will be described one by one.

Each layer of the organic electroluminescent device 3 of the above-described embodiment may be configured as follows.

That is, the light extraction improving layer 99 is a transparent or semitransparent thin film, preferably having high reflectance and, preferably, lower reflectance than its adjacent layers. Possible materials of this light extraction improving layer 99 include, for example, a thin film of elemental metals such as Ag, Au, Cu, Al, Pt, or Mg, and alloys such as MgAg or MgAu; an oxide thin film; a fluoride thin film; or a mixed thin film of an oxide, a fluoride and metal. In particular, Ag, Ag alloy, and Mg alloy have high reflectance, and Ag has a low bulk refractive index of one or less. A thin metal that employs these metals and alloys may be used at a semitransparent film thickness that is greater than or equal to 10 nm and less than or equal to 50 nm, for example. A thin oxide film, thin fluoride film, and thin fluoride and metal mixed film exhibit high transparency in certain cases, and are therefore unrestricted in terms of film thickness. Furthermore, such a thin film has roughness (the boundary surface is not flat) at 10 nm or less, causing the light propagated in the transverse direction to scatter and radiate in the frontal direction. The roughness of Au having a thickness of 3 nm on the substrate 45 is 2.6 nm.

Given a film thickness of 10-50 nm, for example, the transmission of the light extraction improving layer 99 can be established as 1 to 99% or less, particularly 10 to 90%, and more particularly 20 to 70% in the 400 nm to 700 nm visible range. The reflectance of the light extraction improving layer 99 can be established as 1 to 99% or less, particularly 5 to 95%, and more particularly 10 to 70% in the 400 nm to 700 nm visible range.

The light-emitting layer 49 preferably has a refractive index that is about the same as or lower than that of adjacent layers.

1. Exemplary Modifications of the Layered Configuration
(1) Bottom-Emission Type (Equivalent to Configuration 1)

Possible layered configurations of the organic electroluminescent device 3 include configurations such as the one in the above-described embodiment wherein the light extraction improving layer 99 is formed between the hole injection layer 47 and the hole transporting layer 48, as illustrated in the aforementioned FIG. 2, as well as the following configurations.

The layered configuration of the organic electroluminescent device may form a first hole injection layer 47a and a second hole injection layer 47b before and after the light extraction improving layer 99 in place of the layered configuration shown in the aforementioned FIG. 2, as illustrated in FIG. 9. In such a case, the refractive index n of the hole injection layer 47 is made to be the same as or higher than the refractive indices n of the first hole injection layer 47a, the second hole injection layer 47b, and the hole transporting layer 48 in order to take advantage of the property of light that causes light to travel from a location of a low refractive index to a location of a high refractive index, making it possible to improve light extraction efficiency.

The layered configuration of the organic electroluminescent device may form a mixed hole injection layer 47c in place of the first hole injection layer 47a and the hole injection layer 47 in the aforementioned layered configuration shown in FIG. 9, as illustrated in FIG. 10. With this arrangement, it is possible to improve light extraction efficiency as described above.

The layered configuration of the organic electroluminescent device may form a mixed hole transporting layer 48a in place of the hole transporting layer 48 and the second hole injection layer 47b in the aforementioned layered configuration shown in FIG. 9, as illustrated in FIG. 11. With this arrangement, it is possible to improve light extraction efficiency as described above.

The layered configuration of the organic electroluminescent device may form the mixed hole injection layer 47c and the mixed hole transporting layer 48a in place of the first hole injection layer 47a and the hole injection layer 47, and the hole transporting layer 48 and the second hole injection layer 47b, respectively, in the layered configuration of FIG. 9, as illustrated in FIG. 12. With this arrangement, it is possible to improve light extraction efficiency as described above.

(2) Top-Emission Type (Equivalent to Configuration 2)

While the aforementioned embodiment mainly describes the organic electroluminescent device 3 as a bottom-emission type, the invention may also be applied to a top-emission type organic electroluminescent device wherein the light L is outputted from the light-emitting layer 49 via the cathode 52.

The layered configuration of the organic electroluminescent device may form the light extraction improving layer 99 of the layered configuration illustrated in the aforementioned FIG. 2 between the electron transporting layer 50 and the electron injection layer 51 as illustrated in FIG. 13 rather than between the hole transporting layer 48 and the hole injection layer 47. With this arrangement, light extraction efficiency improves.

The layered configuration of the organic electroluminescent device may form a first electron injection layer 51a and a second electron injection layer 51b before and after the light extraction improving layer 99 in place of the layered configuration illustrated in the aforementioned FIG. 13, as illustrated in FIG. 14. With this arrangement, it is possible to improve light extraction efficiency as described above.

The layered configuration of the organic electroluminescent device may form a mixed electron injection layer 51c in place of the first electron injection layer 51a and the electron injection layer 51 in the layered configuration shown in the aforementioned FIG. 14, as illustrated in FIG. 15. With this arrangement, it is possible to improve light extraction efficiency as described above.

The layered configuration of the organic electroluminescent device may form the first electron injection layer 51a and a mixed electron transporting layer 50c in place of the mixed electron injection layer 51c and the second electron injection layer 51b in the layered configuration shown in aforementioned FIG. 15, as illustrated in FIG. 16. With this arrangement, it is possible to improve light extraction efficiency as described above.

The layered configuration of the organic electroluminescent device may form the mixed electron injection layer 51c in place of each of the second electron injection layer 51b and the electron transporting layer 50 in the layered configuration shown in the aforementioned FIG. 15, as illustrated in FIG. 17. With this arrangement, it is possible to improve light extraction efficiency as described above.

In each of the above-described modifications, the anode 46 is best a transparent or semi-transparent thin film, and may employ the material used for the light extraction improving layer 99. In the case of configuration 2, the anode 46 is best a thin film having high reflectance, and may employ in part the material used for the light extraction improving layer 99, preferably having a metal or alloy thickness of 50 nm or greater.

Hole Injection Layer

The refractive index of the hole injection layer 47 is made to be the same as or higher than the refractive indices of the first hole injection layer 47a, the second hole injection layer 47b, and the hole transporting layer 48 (the structure shown in FIG. 9) in order to take advantage of the property of light that causes light to travel from a location of a low refractive index to a location of a high refractive index, thereby further improving light extraction efficiency. Additionally, particularly when the film thickness is a sufficiently thin 10 nm or less, it is possible to eliminate the effect of the refractive index.

First Hole Injection Layer

The refractive index of the first hole injection layer 47a is made to be the same as or lower than that of the hole injection layer 47 and the same as or higher than that of the second hole injection layer 47b or the hole transporting layer 48 in order to take advantage of the property of light that causes light to travel from a location of a low refractive index to a location of a high refractive index, thereby further improving light extraction efficiency. Additionally, particularly when the film thickness is a sufficiently thin 10 nm or less, it is possible to eliminate the effect of the refractive index.

Second Hole Injection Layer

The refractive index of the second hole injection layer 47b is made to be the same as or lower than the refractive indices of the hole injection layer 47 and the first hole injection layer 47a in order to take advantage of the property of light that causes light to travel from a location of a low refractive index to a location of a high refractive index, thereby further improving light extraction efficiency. Additionally, particularly when the film thickness is a sufficiently thin 10 nm or less, it is possible to eliminate the effect of the refractive index.

Hole Transporting Layer

The hole transporting layer 48 is substantially the same as the aforementioned second hole injection layer 47b, and a description thereof will be omitted.

Cathode

With any of the configurations shown in FIG. 2 and FIGS. 9 to 12 (configuration 1: equivalent to a bottom-emission type), the cathode 52 is best a thin film having high reflectance, and may employ in part the material used for the light extraction improving layer 99, preferably with a metal or alloy thickness greater than or equal to 50 nm and less than or equal to 10000 nm. With any of the configurations shown in FIGS. 13 to 17 (configuration 2: equivalent to a top-emission type), the cathode 52 is best a transparent or semitransparent thin film, and may employ the material used for the light extraction improving layer 99, preferably with a thickness greater than or equal to 1 nm and less than or equal to 100 nm Electron Injection Layer The electron injection layer 51 uses a compound that contains a material of energy having a work function that is less than 3.0 eV, such as an alkali metal or alkali earth metal. In particular, Cs has a low work function near 2.0 eV. In a case where organic molecules having electron transportability are mixed into the electron injection layer 51, the electron transporting layer 50 illustrated in FIG. 10, FIG. 11, FIG. 15, and FIG. 16 is sometimes no longer required. The refractive index of the hole injection layer 51 is made to be the same as or higher than the refractive indices of the first electron injection layer 51a, the second electron injection layer 51b, and the electron transporting layer 50 (the structure shown in FIG. 14) in order to take advantage of the property of light that causes light to travel from a location of a low refractive index to a location of a high refractive index, thereby further improving light extraction efficiency. Additionally, particularly when the film thickness is a sufficiently thin 10 nm or less, it is possible to eliminate the effect of the refractive index.

First Electron Injection Layer

With regard to the first electron injection layer 51a, the concept of different doped materials is substantially the same as that of the aforementioned first hole injection layer 47a, and the concept of the refractive index is also substantially the same. That is, the refractive index of the first electron injection layer 51a is made to be the same as or lower than the refractive index of the electron injection layer 51 or the electron transporting layer 50 (the structure shown in FIG. 14), and the same as or higher than the refractive index of the second electron injection layer 51b, in order to take advantage of the property of light that causes light to travel from a location of a low refractive index to a location of a high refractive index, thereby further improving light extraction efficiency. Additionally, particularly when the film thickness is a sufficiently thin 10 nm or less, it is possible to eliminate the effect of the refractive index.

Second Electron Injection Layer

With regard to the second electron injection layer 51b, the concept of different doped materials is substantially the same as that of the aforementioned second hole injection layer 47b, and the concept of the refractive index is also substantially the same. The refractive index of this second electron injection layer 51b is made to be the same as or lower than the refractive indices of the electron injection layer 51 and the first electron injection layer 51a (the structure shown in FIG. 14) in order to take advantage of the property of light that causes light to travel from a location of a low refractive index to a location of a high refractive index, thereby further improving light extraction efficiency. Additionally, particularly when the film thickness is a sufficiently thin 10 nm or less, it is possible to eliminate the effect of the refractive index.

Electron Transporting Layer

The electron transporting layer 50 is substantially the same as the aforementioned electron injection layer 51 and the first electron injection layer 51a, and a description thereof will be omitted.

As described above, the light-emitting device of this embodiment comprises the transparent or semitransparent first electrode 46 (equivalent to the anode), the second electrode 52 (equivalent to the cathode) that forms a pair with the first anode 46 and reflects light, and the organic semiconductor layers 47, 48, 49, 50, and 51, which comprise the photoelectric converting layer 49 (equivalent to the light-emitting layer) that emits light by recombining the holes removed from one of the first electrode 46 and the second electrode 52 with the electrons removed from the other of the first electrode 46 and the second electrode 52, wherein the organic semiconductor layers 47, 48, 49, 50, and 51 comprise between the first electrode 46 and the photoelectric converting layer 49 the light extraction improving layer 99 which contains at least silver or gold in part as a component, partially reflects light, and has transparency. Note that the light-emitting device of such a configuration may be applied not only to the aforementioned organic electroluminescent device 3 but also to other light-emitting devices such as a semiconductor laser.

As described above, the display panel of this embodiment comprises light-emitting devices that make up each pixel, wherein each of the light-emitting device comprises the transparent or semitransparent first electrode 46 (equivalent to the anode), the second electrode 52 (equivalent to the cathode) that forms a pair with the first anode 46 and reflects light, and the organic semiconductor layers 47, 48, 49, 50, and 51, which comprise the photoelectric converting layer 49 (equivalent to the light-emitting layer) that emits light by recombining the holes removed from one of the first electrode 46 and the second electrode 52 with the electrons removed from the other of the first electrode 46 and the second electrode 52, wherein the organic semiconductor layers 47, 48, 49, 50, and 51 comprise between the first electrode 46 and the photoelectric converting layer 49 the light extraction improving layer 99 which contains at least silver or gold in part as a component, partially reflects light, and has transparency.

First, the light-emitting device 3 outputs light in various directions, including the directions along the first electrode 46, the second electrode 52, and the organic semiconductor layers 47, 48, 49, 50, and 51, by recombining holes and electrons in the organic semiconductor layers 47, 48, 49, 50, and 51. The light emitted to the first electrode 46 side is transmitted through the light extraction improving layer 99 and the first electrode 46 having transparency, and outputted to the outside of the light-emitting device 3.

At the same time, the light emitted toward the second electrode 52 side is reflected by the second electrode 52 as a result of the micro-cavity effect and multiple reflection interference effect, transmitted through the organic semiconductor layers 47, 48, 49, 50, and 51, the light extraction improving layer 99, and the first electrode 46, and outputted to the outside of the light-emitting device.

While the light emitted toward the first electrode 46 side, somewhat in the direction along the organic semiconductor layers 47, 48, 49, 50, and 51, tends to disappear inside the prior art organic electroluminescent device that employs a general configuration, the light is scattered in this light-emitting device 3 in accordance with the roughness of the surface of the above-described light extraction improving layer 99, and outputted to the outside of the light-emitting device 3 via the first electrode 46. The light-emitting device 3 improves light extraction efficiency via the light extraction improving layer 99 provided to the organic semiconductor layers 47, 48, 49, 50, and 51, without requiring any manipulation of the substrate 45, thereby improving the overall luminance.

It should be noted that patents such as JP, A, 2008-28371 (Paragraphs 0031 and 0062-0073, Table 6, FIG. 2), JP, A, 2008-59905 (Paragraphs 0044-0047, 0057, 0058, FIG. 2), and JP, A, 2004-79452 (Paragraphs 0041 and 0075-0081, FIG. 3) disclose configurations wherein the light extraction improving layer 99 containing at least Ag in part as a component is formed adjacent to a transparent electrode (the first electrode 46 in the case of a bottom-emission type, and the second electrode 52 in the case of a top-emission type). In such a case, the gains in emission intensity are minimized since the value of the refractive index n of the transparent electrode is a large approximate 2.0 or higher, and light—by its very nature—is guided in the direction of the higher refractive index n. In particular, with the large difference in refractive indices between the transparent electrode and the Ag layer, the above guidance characteristics occur to a significant degree. In contrast, in this embodiment, the light extraction improving layer 99 is formed within the organic semiconductor layers 47, 48, 49, 50, and 51, making it possible to achieve guidance characteristics within the transparent electrode (the first electrode 46 for a bottom-emission type, and the second electrode 52 for a top-emission type) in the same manner as a prior art configuration that does not form the light extraction improving layer 99 and further extract the guided light within the organic semiconductor layers 47, 48, 49, 50, and 51. In consequence, the configuration improves light extraction efficiency and increases overall luminance in comparison to the above-described configuration.

In the light-emitting device 3 of the above-described embodiment, in addition to the aforementioned configuration, the organic semiconductor layer further comprises the hole injection layer 47 that is formed on one of the first electrode 46 and the second electrode 52 (equivalent to the anode in the embodiment, for example) and facilitates the removal of holes from the one electrode, the hole transporting layer 48 that transports the holes removed by the hole injection layer 47 to the photoelectric converting layer 49, the electron injection layer 51 that facilitates the removal of electrons from the other of the first electrode 46 and the second electrode 52 (equivalent to the cathode in the embodiment, for example), and the hole transporting layer 50 that transports electrons removed by the electron injection layer 51 to the photoelectric converting layer 49.

A light-emitting device having such a configuration is called an organic electroluminescent device. With such a configuration, the photoelectric converting layer 49 of the organic electroluminescent device 3 outputs light in various directions including the directions along the first electrode 46 side, the second electrode 52 side, and the photoelectric converting layer 49 side by recombining the holes and electrons. The light emitted toward the first electrode 46 side is transmitted through the light extraction improving layer 99 and the first electrode 46 having transparency, and outputted to the outside of the organic electroluminescent device 3.

At the same time, the light emitted toward the second electrode 52 side is reflected by the second electrode 42 as a result of the micro-cavity effect and multiple reflection interference effect, transmitted through the organic semiconductor layers 47, 48, 49, 50, and 51, the light extraction improving layer 99, and the first electrode 46, and outputted to the outside of the organic electroluminescent device 3.

While the light emitted toward the first electrode 46, somewhat in the direction along the photoelectric converting layer 49, tends to disappear inside the prior art organic electroluminescent device 3 that employs a general configuration, the light is scattered in this organic electroluminescent device 3 in accordance with the roughness of the surface of the above-described light extraction improving layer 99, and outputted to the outside of the organic electroluminescent device 3 via the first electrode 46. The organic electroluminescent device 3 thus enhances light extraction efficiency via the light extraction improving layer 99, thereby increasing the overall luminescence.

The light-emitting device 3 of the above-described embodiment, in addition to the aforementioned configuration, has refractive indices which decrease in the order of the first electrode 46, the organic semiconductor layers 47, 48,

49, 50, 51, and the light extraction improving layer 99, or are substantially the same for the first electrode 46, the organic semiconductor layers 47, 48, 49, 50, 51, and the light extraction improving layer 99.

When the refractive index of each layer is thus established, the light-emitting device 3 can take advantage of the property of light that causes light to travel from a location of a low refractive index to a location of a high refractive index, thereby further improving light extraction efficiency.

In the light-emitting device 3 of the above embodiment, in addition to the aforementioned configuration, the film thickness of the above-described light extraction improving layer 99 is greater than or equal to 10 nm and less than or equal to 50 nm With this arrangement, even in a case where the light extraction improving layer 99 is inserted, the light extraction efficiency can be improved while the function of the light-emitting device 3 is maintained.

In the light-emitting device 3 of the above embodiment, in addition to the aforementioned configuration, the light extraction improving layer 99 is formed between the hole injection layer 47 and the hole transporting layer 48.

With this arrangement, the light outputted by the light-emitting layer 49 is efficiently extracted from the anode 46 side to outside the organic electroluminescent device 3 via the light extraction improving layer 99. As a result, in a case where the organic electroluminescent device 3 is a so-called bottom-emission type, the organic electroluminescent device 3 is particularly capable of improving light extraction efficiency.

In the light-emitting device 3 of the above embodiment, in addition to the aforementioned configuration, the light extraction improving layer 99 is formed between the electron injection layer 51 and the hole transporting layer 50.

With this arrangement, the light outputted by the light-emitting layer 49 is efficiently extracted from the cathode 52 side to outside the organic electroluminescent device 3 via the light extraction improving layer 99. As a result, in a case where the organic electroluminescent device 3 is a so-called top-emission type, the organic electroluminescent device 3 is particularly capable of improving light extraction efficiency.

2. When the Emission Spectrum of the Light-Emitting Layer is Limited

In general, in the case of an organic electroluminescent device comprising the cathode 52 (the anode 46 for a top-emission type; hereinafter the same), which is a reflective electrode, and the transparent or semitransparent anode 46 (the cathode 52 for a top-emission type; hereinafter the same), the possibility exists that a blue shift will occur in the emission spectrum in accordance with the angle at which the display of the device is viewed (the view angle) due to an interference effect that results from the difference in refractive indices between the anode 46 and the glass substrate 45 caused by a difference in material and the spherical shape of the surface on the organic semiconductor layer side of the cathode 52. In particular, as in the aforementioned embodiment, in the case of an organic electroluminescent device in which the light extraction improving layer 99 is formed to improve light extraction efficiency and the micro-cavity effect and the multiple reflection interference effect are employed, the interference effect is fully utilized, resulting in the possibility of the occurrence of problems such as a greater shift in color tone according to view angle and a significant breakdown in white balance, particularly in a case where white light is emitted. In such a case, even if a color filter is employed, for example, color purity can be increased but view angle dependency (view angle characteristics), i.e., the color shift according to the angle at which the display is viewed, as described above, cannot be improved. In this exemplary modification, the emission spectrum of the light-emitting layer 49 is limited to resolve such problems.

The inventors of this application suitably changed the thickness of the light extraction improving layer 99, etc, while changing the light-emitting material constituting the light-emitting layer 49 to a plurality of types, and measured the luminance L, total luminous flux, and amount of change in CIE (Commission Internationale de L' eclairage) chromaticity coordinates. The details are described below.

In this exemplary modification, five types of materials are used as the light-emitting material of the light-emitting layer 49: $Alq_3$, Irppy, C545T, red Ir complex, and PtOEP. FIG. 18 shows the chemical structural formulas of each of these light-emitting materials.

FIG. 19 is a diagram illustrating an example of the emission spectrums of each of the five types of light-emitting materials constituting the light-emitting layer 49, and FIG. 20 is a table indicating an example of the half widths and standardized emission spectrum surface areas of these spectrums.

In the examples illustrated in FIG. 19, the horizontal axis indicates wavelength (nm) and the vertical axis indicates emission intensity, with the maximum emission intensity of each spectrum standardized to 1. In this example, the five types of light-emitting materials are represented as follows: $Alq_3$ by a solid line, Irppy by a long dashed line, C545T by a short dashed line, red Ir complex by an alternate long and short dashed line, and PtOEP by a chain double-dashed line.

As illustrated in FIG. 20, the half widths (nm) of the spectrums of the five light-emitting materials $Alq_3$, Irppy, C545T, red IR complex, and PtOEP are 110, 90, 65, 90, and 20, respectively, and the standardized emission spectrum surface areas are 111, 88, 67, 98, and 33, respectively. Here, the standardized emission spectrum surface area refers to the total sum of the emission intensities per 1 nm wavelength when the maximum emission intensity of the emission spectrum is standardized to 1, and is found by the following equation:

$$T = \sum_{\lambda\,min}^{\lambda\,max} I_\lambda \qquad \text{Equation 1}$$

In the above equation, T is the standardized emission spectrum surface area, $I_\lambda$ is the emission intensity given a wavelength $\lambda$ in a case where the maximum emission intensity of the emission spectrum is standardized to 1, and $\lambda max$ and $\lambda min$ are the maximum value and minimum value of the wavelength region of the emission spectrum.

FIG. 21 is a table showing an example of the luminance L, total luminous flux, and amount of change in CIE chromaticity coordinates when $Alq_3$ is used as the light-emitting material.

In the example shown in FIG. 21, the anode 46, the hole injection layer 47, the light extraction improving layer 99, the hole transporting layer 48, the light-emitting layer 49, the electron transporting layer 50, the electron injection layer 51, and the cathode 52 are made of the following materials, respectively (note that the slash mark indicates the separation between each layer): ITO/HIL (hole injection layer)/Ag (X nm)/$MoO_3$ (3 nm)/NPB (42 nm)/$Alq_3$ (60 nm)/$Li_2O$/Al. In this case, as described above, $MoO_3$ is a functional layer, and $Alq_3$ is a layer that functions as both the light-emitting layer 49 and the electron transporting layer 50 (hereinafter the same). The values within parentheses indicate the film thickness of each layer.

In FIG. 21, ΔCIE indicates the change in chromaticity when the view angle changes from 0° (front) to 60°. Additionally, the Assessment column assesses the acceptability of the three items of the luminance L, total luminous flux, and change in CIE chromaticity coordinates, indicating a circle when three items or more are acceptable, a triangle when two items are acceptable, and an X when one item or less is acceptable. The assessment is determined to be acceptable for the luminance L and total luminous flux when the light-emitting device is compared with the comparison example described in the uppermost area of the table and the value is greater than that of the comparison example, and for the amount of change in chromaticity coordinates when the value is roughly 0.050 or less. In general, in a case where the amount of change in chromaticity coordinates is about 0.050 or less, view angle dependability (view angle characteristics) is considered improvable. Items assessed as acceptable are shaded in the table. Note that the comparison example described in the uppermost area of the table is an example in a case where the organic electroluminescent device is without a light extraction improving layer 99 and does not utilize the micro-cavity effect or the multiple reflection interference effect. In this comparison example, the material used for the hole injection layer 47 is CuPc (copper phthalocyanine) in one example, and TPA (triphenylamine) in the other examples.

In the examples shown in FIG. 21, when the thickness of the light extraction improving layer 99 is 5 nm, for example, the amount of change in the chromaticity coordinates is acceptable at 0.038, which is less than or equal to 0.050; however, since the luminance L and total luminous flux values are less than those of the comparison example, only one item is assessed as acceptable, resulting in the final assessment of X. Additionally, when the thickness of the light extraction improving layer 99 is 10, 15, 20, or 25 nm, for example, the luminance L and the total luminous flux values are acceptable since they are greater than those of the comparison example; however, since the amount of change in the chromaticity coordinates is greater than 0.050, only two items are assessed as acceptable, resulting in the final assessment of Δ.

FIG. 22 is a table showing an example of the luminance L, total luminous flux, and amount of change in CIE chromaticity coordinates when Irppy is used as the light-emitting material.

In the example shown in FIG. 22, the anode 46, the hole injection layer 47, the light extraction improving layer 99, the hole transporting layer 48, the light-emitting layer 49, the electron transporting layer 50, the electron injection layer 51, and the cathode 52 are made of the following materials, respectively (note that the slash mark indicates the separation between each layer): ITO/HIL/Ag (X nm)/MoO$_3$ (3 nm)/NPB/9% Irppy: TAZ (40 nm)/Alq$_3$ (20 nm)/Li$_2$O (10 nm)/Al (80 nm). Here, "9% Irppy: TAZ" indicates a layer wherein 9% Irppy is mixed with TAZ (triazine derivative). Additionally, Alq$_3$ in this example functions as the electron transporting layer 50 (hereinafter the same).

In the example shown in FIG. 22, when the thickness values of the light extraction improving layer 99 and the hole transporting layer 48 are 15 nm and 37 nm, 18 nm and 37 nm, or 22 nm and 37 nm, respectively, the luminance L and total luminous flux values are greater than those of the comparison example and the amount of change in the chromaticity coordinates is less than or equal to roughly 0.050 (the amount of change in chromaticity coordinates when the thickness values of the light extraction improving layer 99 and the hole transporting layer 48 are 22 nm and 37 nm, respectively, is greater than 0.050 at 0.058, but still within the permissible range and therefore acceptable), resulting in three items assessed as acceptable and a final assessment of O. In consequence, compared to the comparison example, improved view angle dependability (view angle characteristics), superior color purity, and enhanced light extraction efficiency are achieved. In all other examples, two items are assessed as acceptable, resulting in a final assessment of Δ.

FIG. 23 is a table showing an example of the luminance L, total luminous flux, and amount of change in CIE chromaticity coordinates when C545T is used as the light-emitting material.

In the example shown in FIG. 23, the anode 46, the hole injection layer 47, the light extraction improving layer 99, the hole transporting layer 48, the light-emitting layer 49, the electron transporting layer 50, the electron injection layer 51, and the cathode 52 are made of the following materials, respectively (note that the slash mark indicates the separation between each layer): ITO/HIL/Ag (X nm)/MoO$_3$ (3 nm)/NPB/C545T: Alq$_3$ (0.75:2, 40 nm)/Alq$_3$ (20 nm) Li$_2$O (10 nm)/Al (80 nm). Here, "C545T: Alq$_3$ (0.75:2, 40 nm)" indicates a layer wherein C545T and Alq$_3$ are mixed together at a ratio of 0.75:2.0.

In the example shown in FIG. 23, when the thickness values of the light extraction improving layer 99 and the hole transporting layer 48 are 15 nm and 37 nm, 20 nm and 37 nm, 20 nm and 42 nm, 25 nm and 37 nm, or 25 nm and 42 nm, respectively, for example, the luminance L and total luminous flux values are greater than the comparison example (the total luminous flux when the thickness values of the light extraction improving layer 99 and the hole transporting layer 48 are 25 nm and 37 nm, respectively, is 0.95, which is smaller than the comparison value of 1.00, but still within the permissible range and therefore acceptable) and the amount of change in chromaticity coordinates is less than 0.050, resulting in three items assessed as acceptable and a final assessment of O. In consequence, compared to the comparison example, improved view angle dependability (view angle characteristics), superior color purity, and enhanced light extraction efficiency are achieved. In all other examples, two items are assessed as acceptable, resulting in a final assessment of Δ.

FIG. 24 is a table showing an example of the luminance L, total luminous flux, and amount of change in CIE chromaticity coordinates when red IR complex is used as the light-emitting material.

In the example shown in FIG. 24, the anode 46, the hole injection layer 47, the light extraction improving layer 99, the hole transporting layer 48, the light-emitting layer 49, the electron transporting layer 50, the electron injection layer 51, and the cathode 52 are made of the following materials, respectively (note that the slash mark indicates the separation between each layer): ITO/HIL/Ag (X nm)/MoO$_3$ (3 nm)/NPB/red Ir complex: quinoline derivative (40 nm)/Alq$_3$ (37.5 nm)/Li$_2$O (10 nm)/Al (80 nm).

In the example shown in FIG. 24, when the thickness values of the light extraction improving layer 99 and the hole transporting layer 48 are 20 nm and 52 nm or 20 nm and 62 nm, respectively, for example, the luminance L and total luminous flux values are greater than those of the comparison example and the amount of change in chromaticity coordinates is greater than 0.050 but within the permissible range, resulting in three items assessed as acceptable and therefore a final assessment of O. In consequence, compared to the comparison example, improved view angle dependability (view angle characteristics), superior color purity, and enhanced light extraction efficiency are achieved. In the other example, two items are assessed as acceptable, resulting in a final assessment of Δ.

FIG. 25 is a table showing an example of the luminance L, total luminous flux, and amount of change in CIE chromaticity coordinates when PtOEP is used as the light-emitting material.

In the example shown in FIG. 25, the anode 46, the hole injection layer 47, the light extraction improving layer 99, the hole transporting layer 48, the light-emitting layer 49, the electron transporting layer 50, the electron injection layer 51, and the cathode 52 are made of the following materials, respectively (note that the slash mark indicates the separation between each layer): ITO/HIL/Ag (X nm)/MoO$_3$ (3 nm)/NPB/9% PtOEP: Alq$_3$ (40 nm)/Alq$_3$ (37.5 nm)/Li$_2$O (10 nm)/Al (80 nm).

In the example shown in FIG. 25, when the thickness values of the light extraction improving layer 99 and the hole transporting layer 48 are 20 nm and 52 nm or 20 nm and 62 nm, respectively, for example, the luminance L and total luminous flux values are greater than those of the comparison example and the amount of change in chromaticity coordinates is smaller than 0.050, resulting in three items assessed as acceptable and therefore a final assessment of O. In consequence, compared to the comparison example, improved view angle dependability (view angle characteristics), superior color purity, and enhanced light extraction efficiency are achieved. In each of the other examples, two items are assessed as the same or higher, resulting in a final assessment of Δ.

FIG. 26 is a table showing examples of the half width of the emission spectrum, the standardized emission spectrum surface area, and the amount of change in chromaticity coordinates from the aforementioned measurement results of the five types of light-emitting materials constituting the light-emitting layer 49.

In the examples shown in FIG. 26, the values selected for the amount of change in chromaticity coordinates of the aforementioned FIG. 21 to FIG. 25 are those of the cases of each light-emitting material where the thickness of the light extraction improving layer 99 is approximately 20 nm and the combined thickness of the functional layer (MoO$_3$: 3 nm) and the hole transporting layer 48 is equal to the thickness of the hole transporting layer 48 of the comparison example indicated in the uppermost area of each table. Note that the lines including a selected value are each indicated by an arrow in the aforementioned FIG. 21 to FIG. 25. Additionally, in FIG. 26, the "No Micro-Cavity Structure" column under the "Amount of Change in Chromaticity Coordinates" column indicates the amount of change in chromaticity coordinates of the comparison example indicated in the uppermost area of each table, and the "Micro-Cavity Structure" column indicates the selected amount of change in chromaticity coordinates described above.

FIG. 27 is a diagram illustrating an example of the relationship between half width and the amount of change in chromaticity coordinates (with a micro-cavity structure), based on the measurement results indicated in FIG. 26.

As shown in FIG. 27, the amount of change in chromaticity coordinates decreases to the extent that the half width of the emission spectrum decreases. Additionally, as indicated by the approximated curve X that is based on the measurement results of each light-emitting material, the amount of change in chromaticity coordinates falls substantially within the range of 0.03 to 0.05 when the half width is within the range of 80 nm or less. That is, when the half width of the emission spectrum is greater than or equal to 1 nm and less than or equal to 80 nm, the amount of change in chromaticity coordinates is approximately 0.050 or less as described above, making it possible to improve view angle dependability (view angle characteristics).

FIG. 28 is a diagram illustrating an example of the relationship between emission spectrum surface area and the amount of change in chromaticity coordinates (with a micro-cavity structure), based on the measurement results indicated in FIG. 26.

As shown in FIG. 28, the amount of change in chromaticity coordinates decreases to the extent that the standardized emission spectrum surface area decreases. Additionally, as indicated by the approximated curve Y that is based on the measured values of each light-emitting material, the amount of change in chromaticity coordinates falls substantially within the range of 0.03 to 0.05 when the emission spectrum surface area is within the range of 80 or less. That is, when the emission spectrum surface area is greater than or equal to 1 and less than or equal to 80, the amount of change in chromaticity coordinates is approximately 0.050 or less as described above, making it possible to improve view angle dependability (view angle characteristics).

In the light-emitting device 3 of the above exemplary modification, in addition to the above configuration, the half width of the emission spectrum of the photoelectric converting layer 49 is greater than or equal to 1 nm and less than or equal to 80 nm, or the emission spectrum surface area, which is the total sum of the emission intensities per 1 nm wavelength when the maximum emission intensity of the emission spectrum is standardized to 1 is greater than or equal to 1 and less than or equal to 80.

With this arrangement, the amount of change in the CIE chromaticity coordinates falls within the range of 0.03 to 0.05, making it possible to improve view angle dependency (view angle characteristics) and achieve superior color purity and enhanced light extraction efficiency.

3. When the Light Extraction Improving Layer is Discontinuous or the Resistance Value is Increased In the case of an organic electroluminescent device wherein the light extraction improving layer 99 is formed to improve light extraction efficiency as in the aforementioned embodiment, the light extraction improving layer 99 is made of a material that is reflective, transparent, and conductive, and has substantially the same conductivity (resistance) as the anode 46 (the cathode 52 for a top-emission type; hereinafter the same), resulting in the possibility of problems such as a short occurring with the anode 46, causing failure of observation or achievement of light emission. In this exemplary modification, the light extraction improving layer 99 is made discontinuous in a predetermined region or the resistance value is increased in order to resolve such problems.

FIG. 29 is a diagram illustrating a conceptual configuration example of a display panel to which the organic electroluminescent device 3 is applied, along with a partially enlarged view of a section thereof.

In the example shown in FIG. 29, the display panel has a passive matrix configuration, for example (an active matrix configuration is also acceptable). In the example, the display panel is configured by disposing a plurality of the anodes 46 (anodes 46-1 to 46-$m$) in parallel on the glass substrate 45; layering the hole injection layer 47, the light extraction improving layer 99, the hole transporting layer 48, the light-emitting layer 49, the electron transporting layer 50, and the electron injection layer 51 on top of the plurality of anodes 46; and then layering a plurality of the cathodes 52 (cathodes 52-1 to 52-$n$) on top of those layers, orthogonal to the anodes 46.

The partially enlarged view in FIG. 29 illustrates the positional relationship of each of the light-emitting devices 3, a partition 60, and a segmented portion 65 (equivalent to a discontinuous portion) of the light extraction improving layer 99 for four of the organic electroluminescent devices 3 (four pixels) within a display panel, for example. Note that, in this partially enlarged view, the images of layered components other than the light extraction improving layer 99 are omitted for the sake of simplicity. The partition 60 is provided so as to extend in a direction substantially parallel to the cathodes 52, separating the hole injection layer 47, the light extraction improving layer 99, the hole transporting layer 48, the light-emitting layer 49, the electron transporting layer 50, the electron injecting layer 51, and the cathode 52 of the light-emitting devices 3 adjacent in the direction along the anode 46 (refer to FIG. 30 described later). On the other hand, the segmented portion 65 is a discontinuous section resulting from segmentation of the light extraction improving layer 99 (refer to FIG. 31 described later), and is provided between the light-emitting devices 3 adjacent in the direction along the partition 60.

FIG. 30 is a cross-sectional view illustrating an example of the cross-section along line A-A in FIG. 29. Note that, in FIG. 30, the hole transporting layer 48, the light-emitting layer 49, the electron transporting layer 50, and the electron injection layer 51 are illustrated as one layer for the sake of simplicity.

In the example shown in FIG. 30, the emission area confining layer 54 is formed orthogonal to the anode 46 provided on the glass substrate 45, and the partition 60 of an inverted tapered shape and made of an insulating material is formed on this emission area confining layer 54. The emission area confining layer 54 and the partition 60 separate the hole injection layer 47, the light extraction improving layer 99, the hole transporting layer 48, the light-emitting layer 49, the electron transporting layer 50, the electron injection layer 51, and the cathode 52 of the adjacent light-emitting devices 3, as described above.

FIG. 31 is a cross-sectional view illustrating an example of the cross-section along line B-B in FIG. 29. Note that, in FIG. 31, the hole transporting layer 48, the light-emitting layer 49, the electron transporting layer 50, and the electron injection layer 51 are illustrated as one layer for the sake of simplicity, similar to FIG. 30 described above.

As shown in FIG. 31, the light extraction improving layer 99 comprises the segmented portion 65 in a region other than on the anode 46. The segmented portion 65 is a section that is discontinuous due to the segmentation of the light extraction improving layer 99, and may be made of the same material as the hole injection layer 47 or the hole transporting layer 48, for example, or of another material. Note that while the segmented portion 65 is provided only to a region other than on the anode 46, the present invention is not limited thereto, allowing provision of the segmented portion 65 on the anode 46 as long as there is no loss in the light extraction improving function of the light extraction improving layer 99.

Possible methods of formation of the segmented portion 65 include etching of the desired location of the light extraction improving layer 99 by plasma etching, etc., or hole-drilling in the stainless base material and forming the light extraction improving layer 99. Or, the segmented portion 65 may be formed by forming the light extraction improving layer 99 on a donor sheet, and transferring the light extraction improving layer 99 from the donor sheet to the hole injection layer 47 by performing laser radiation at the desired location. The transferred location is not necessarily limited to above the hole injection layer 47, allowing transfer to above the anode 46 of each of the hole injection layers 47. Additionally, the segmented portion 65 may be formed by dissolving the material of the light extraction improving layer 99 and forming the light extraction improving layer 99 on the desired area by inkjetting. The light extraction improving layer 99 may also be segmented by providing a partition on the hole injection layer 47.

In the light-emitting device 3 of the above exemplary modification, in addition to the aforementioned configuration, the light extraction improving layer 99 further comprises the discontinuous portion 65 (equivalent to the segmented portion).

With this arrangement, in contrast to a case where the discontinuous portion 65 is not provided to the light extraction improving layer 99, for example, and the light extraction improving layer 99 is made of a material that is reflective, transparent, and conductive and has substantially the same level of conductivity (resistance) as the anode 46, resulting in the possibility of problems such as a short occurring with the anode 46 and, in turn, failure of observation or achievement of light emission when a plurality of pixels are lit on the display panel, the above exemplary modification provides the discontinuous portion 65 to the light extraction improving layer 99, making it possible to prevent shorts from occurring with the anode 46. With this arrangement, each of the organic electroluminescent devices 3 is capable of independently emitting light.

In the light-emitting device of the above exemplary modification, in addition to the aforementioned configuration, the discontinuous portion 65 is formed in a region other than on the first electrode 46 of the light extraction improving layer 99. With this arrangement, there is no loss in the light extraction improving function of the light extraction improving layer 99, making it possible to prevent shorts with the anode 46.

Note that while the above configuration provides the discontinuous portion 65 to the light extraction improving layer 99, a resistance increasing portion that increases the resistance of the light extraction improving layer 99 may also be provided. FIG. 32 is a cross-sectional view illustrating an example of the cross-section along line B-B in FIG. 29 in such a case.

As shown in FIG. 32, the light extraction improving layer 99 further comprises a resistance increasing portion 66 in a region other than on the anode 46. The resistance increasing portion 66 increases the resistance of the light extraction improving layer 99 to a value higher than the other sections by heat treatment (laser) under an environment in which oxygen exists to a certain degree, or by thinning the light extraction improving layer 99, for example.

In the light-emitting device 3 of the above exemplary modification, in addition to the aforementioned configuration, the light extraction improving layer 99 further comprises the resistance increasing portion 66 disposed in a region other than on the first anode 46, that increases the resistance value. With this arrangement, shorts with the anode 46 can be prevented, making it possible for each of the organic electroluminescent devices 3 to independently emit light.

Note that while the substrate 45 is disposed on the anode 46 side as an example in the above, the present invention is not limited thereto, allowing the substrate 45 to be disposed on the cathode 52 side.

Other than those previously described above, approaches according to the respective embodiments and exemplary modifications may be utilized in combination as appropriate.

What is claimed is:

1. A light-emitting device comprising:
a transparent or semitransparent first electrode;
a second electrode that forms a pair with said first electrode and reflects light; and
an organic semiconductor layer comprising a photoelectric converting layer that emits light by recombining holes removed from one of said first electrode and said second electrode with electrons removed from the other of said first electrode and said second electrode; wherein:
said organic semiconductor layer comprises:
between said first electrode and said photoelectric converting layer a light extraction improving layer that contains at least silver or gold in part as a component, partially reflects light, and has transparency;
a hole injection layer that is formed on one of said first electrode and said second electrode and facilitates the removal of holes from said one electrode;
a hole transporting layer that transports holes removed by said hole injection layer to said photoelectric converting layer;
an electron injection layer that facilitates the removal of electrons from the other of said first electrode and said second electrode; and
an electron transporting layer that transports electrons removed by said electron injection layer to said photoelectric converting layer;
wherein said light extraction improving layer is formed between said hole injection layer and said hole transporting layer,
said light extraction improving layer further comprises a discontinuous portion and,
said discontinuous portion is formed in a region of said light extraction improving layer other than over said first electrode.

2. The light-emitting device according to claim 1, wherein:
refractive indices of said first electrode, said organic semiconductor layer, and said light extraction improving layer either decrease in that order or are substantially similar to one another.

3. The light-emitting device according to claim 2, wherein:
a half width of an emission spectrum of said photoelectric converting layer is greater than or equal to 1 nm and less than or equal to 80 nm, or an emission spectrum surface area, which is a total sum of emission intensities per 1 nm wavelength when a maximum emission intensity of said emission spectrum is standardized to 1, is greater than or equal to 1 and less than or equal to 80.

4. The light-emitting device according to claim 2, wherein:
said light extraction improving layer further comprises a resistance increasing portion disposed in a region other than on said first electrode, that increases a resistance value.

5. The light-emitting device according to claim 1, wherein:
a film thickness of said light extraction improving layer is greater than or equal to 10 nm and less than or equal to 50 nm.

6. The light-emitting device according to claim 5, wherein:
a half width of an emission spectrum of said photoelectric converting layer is greater than or equal to 1 nm and less than or equal to 80 nm, or an emission spectrum surface area, which is a total sum of emission intensities per 1 nm wavelength when a maximum emission intensity of said emission spectrum is standardized to 1, is greater than or equal to 1 and less than or equal to 80.

7. The light-emitting device according to claim 1, wherein:
a half width of an emission spectrum of said photoelectric converting layer is greater than or equal to 1 nm and less than or equal to 80 nm, or an emission spectrum surface area, which is a total sum of emission intensities per 1 nm wavelength when a maximum emission intensity of said emission spectrum is standardized to 1, is greater than or equal to 1 and less than or equal to 80.

8. The light-emitting device according to claim 1, wherein:
said light extraction improving layer further comprises a resistance increasing portion disposed in a region other than on said first electrode, that increases a resistance value.

9. A display panel wherein each pixel is made of a light-emitting device, the light-emitting device comprising:
a transparent or semitransparent first electrode;
a second electrode that forms a pair with said first electrode and reflects light; and
an organic semiconductor layer comprising a photoelectric converting layer that emits light by recombining holes removed from one of said first electrode and said second electrode with electrons removed from the other of said first electrode and said second electrode; wherein:
said organic semiconductor layer comprises:
between said first electrode and said photoelectric converting layer a light extraction improving layer that contains at least silver or gold in part as a component, partially reflects light, and has transparency;
a hole injection layer that is formed on one of said first electrode and said second electrode and facilitates the removal of holes from said one electrode;
a hole transporting layer that transports holes removed by said hole injection layer to said photoelectric converting layer;
an electron injection layer that facilitates the removal of electrons from the other of said first electrode and said second electrode; and
an electron transporting layer that transports electrons removed by said electron injection layer to said photoelectric converting layer;
wherein said light extraction improving layer is formed between said hole injection layer and said hole transporting layer,
said light extraction improving layer further comprises a discontinuous portion and,
said discontinuous portion is formed in a region of said light extraction improving layer other than over said first electrode.

* * * * *